US008503682B2

(12) United States Patent
Fukui et al.

(10) Patent No.: US 8,503,682 B2
(45) Date of Patent: Aug. 6, 2013

(54) HEAD-RELATED TRANSFER FUNCTION CONVOLUTION METHOD AND HEAD-RELATED TRANSFER FUNCTION CONVOLUTION DEVICE

(75) Inventors: Takao Fukui, Tokyo (JP); Ayataka Nishio, Kanagawa (JP)

(73) Assignee: Sony Corporation, Tokyo (JP)

(*) Notice: Subject to any disclaimer, the term of this patent is extended or adjusted under 35 U.S.C. 154(b) by 1016 days.

(21) Appl. No.: 12/366,095

(22) Filed: Feb. 5, 2009

(65) Prior Publication Data

US 2009/0214045 A1 Aug. 27, 2009

(30) Foreign Application Priority Data

Feb. 27, 2008 (JP) ................................ 2008-045597

(51) Int. Cl.
*H04R 5/00* (2006.01)
*H03G 3/00* (2006.01)

(52) U.S. Cl.
USPC ...................... 381/17; 381/1; 381/18; 381/63

(58) Field of Classification Search
USPC .......................................... 381/1, 17, 18, 63
See application file for complete search history.

(56) References Cited

U.S. PATENT DOCUMENTS 4,731,848 A * 3/1988 Kendall et al. .................. 381/63
5,181,248 A 1/1993 Inanaga et al.
5,717,767 A 2/1998 Inanaga et al.
5,844,816 A 12/1998 Inanaga et al.
6,501,843 B2 12/2002 Usui et al.
6,801,627 B1 * 10/2004 Kobayashi ...................... 381/17
2005/0047619 A1 3/2005 Murata et al.
2006/0045294 A1 * 3/2006 Smyth .......................... 381/309
2008/0273708 A1 * 11/2008 Sandgren et al. ............... 381/63
2009/0208022 A1 8/2009 Fukui et al.

(Continued)

FOREIGN PATENT DOCUMENTS

JP 61-245698 A 10/1986
JP 3-214897 9/1991

(Continued)

OTHER PUBLICATIONS

Kendall et al. "A Spatial Sound Processor for Loudspeaker and Headphone Reproduction" Journal of the Audio Engineering Society, May 30, 1990, vol. 8 No. 27, pp. 209-221, New York, NY.

*Primary Examiner* — S. V. Clark
*Assistant Examiner* — Jesse Y Miyoshi
(74) *Attorney, Agent, or Firm* — Wolf, Greenfield & Sacks, P.C.

(57) ABSTRACT

A head-related transfer function (HRTF) convolution method arranged, when an audio signal is reproduced acoustically by an electro-acoustic conversion unit disposed in a nearby position of both ears of a listener, to convolute an HRTF into the audio signal, which allows the listener to listen to the audio signal such that a sound image is localized in a perceived virtual sound image localization position, the method including the steps of: measuring, when a sound source is disposed in the virtual sound image localization position, and a sound-collecting unit is disposed in the position of the electro-acoustic conversion unit, a direct-wave direction HRTF regarding the direction of a direct wave, and reflected-wave direction HRTFs regarding the directions of selected one or more reflected waves, from the sound source to the sound-collecting unit, separately beforehand; and convoluting the obtained direct-wave direction HRTF, and the reflected-wave direction HRTFs into the audio signal.

11 Claims, 30 Drawing Sheets

U.S. PATENT DOCUMENTS

| | | | |
|---|---|---|---|
| 2010/0322428 | A1 | 12/2010 | Fukui et al. |
| 2011/0286601 | A1 | 11/2011 | Fukui et al. |
| 2011/0305358 | A1 | 12/2011 | Nishio et al. |

FOREIGN PATENT DOCUMENTS

| | | | |
|---|---|---|---|
| JP | 5-260590 | A | 10/1993 |
| JP | 6-147968 | A | 5/1994 |
| JP | 06-165299 | A | 6/1994 |
| JP | 06-181600 | A | 6/1994 |
| JP | 07-312800 | A | 11/1995 |
| JP | 8-047078 | A | 2/1996 |
| JP | 8-182100 | A | 7/1996 |
| JP | 09-037397 | A | 2/1997 |
| JP | 09-135499 | A | 5/1997 |
| JP | 09-187100 | A | 7/1997 |
| JP | 09-284899 | A | 10/1997 |
| JP | 10-042399 | A | 2/1998 |
| JP | 11-313398 | | 11/1999 |
| JP | 2000-036998 | A | 2/2000 |
| JP | 2001-285998 | A | 10/2001 |
| JP | 2002-209300 | A | 7/2002 |
| JP | 2003-061196 | A | 2/2003 |
| JP | 2003-061200 | A | 2/2003 |
| JP | 2004-080668 | A | 3/2004 |
| JP | 2005-157278 | A | 6/2005 |
| JP | 2007-240605 | A | 9/2007 |
| JP | 2007-329631 | A | 12/2007 |
| WO | WO 95/13690 | | 5/1995 |
| WO | WO 95/23493 | A1 | 8/1995 |
| WO | WO 01/31973 | A1 | 5/2001 |

* cited by examiner

HEAD-RELATED TRANSFER FUNCTION CONVOLUTION METHOD AND HEAD-RELATED TRANSFER FUNCTION CONVOLUTION DEVICE

CROSS REFERENCES TO RELATED APPLICATIONS

The present invention contains subject matter related to Japanese Patent Application JP 2008-045597 filed in the Japanese Patent Office on Feb. 27, 2008, the entire contents of which are incorporated herein by reference.

BACKGROUND OF THE INVENTION

1. Field of the Invention

The present invention relates to a convolution method and convolution device for convoluting into an audio signal a head-related transfer function (hereafter abbreviated to "HRTF") for enabling a listener to hear a sound source situated in front or the like of the listener, during acoustic reproduction with an electric-acoustic unit such as an acoustic reproduction driver of headphones for example, which is disposed near the ears of the listener.

2. Description of the Related Art

In a case of the listener wearing the headphones on the head for example, and listening to acoustically reproduced signals with both ears, if the audio signals reproduced at the headphones are commonly-employed audio signals supplied to speakers disposed to the left and right in front of the listener, the so-called lateralization phenomenon, wherein the reproduced sound image stays within the head of the listener, occurs.

A technique called virtual sound image localization is disclosed in WO95/13690 Publication and Japanese Unexamined Patent Application Publication No. 03-214897, for example, as having solved this problem of the lateralization phenomenon. This virtual sound image localization enables the sound image to be reproduced (virtually localized in the relevant position) such that when reproduced with a headphone or the like, the sound image is reproduced as if there were a sound source, e.g., speakers in a predetermined perceived position, such as the left and right in front of the listener, and is realized as described below.

FIG. 30 is a diagram for describing a technique of virtual sound image localization in a case of reproducing two-channel stereo signals of left and right with two-channel stereo headphones, for example.

As shown in FIG. 30, at a position nearby both ears of the listener regarding which placement of two acoustic reproduction drivers such as two-channel stereo headphones for example (an example of an electro-acoustic conversion unit) is assumed, microphones (an example of an acousto-electric conversion unit) ML and MR are disposed, and also speakers SPL and SPR are disposed at positions at which virtual sound image localization is desired.

In a state where a dummy head 1 (alternatively, this may be a human, the listener himself/herself) is present, an acoustic reproduction of an impulse for example, is performed at one channel, the left channel speaker SPL for example, and the impulse emitted by that reproduction is picked up with each of the microphones ML and MR and an HRTF for the left channel is measured. In the case of this example, the HRTF is measured as an impulse response.

In this case, the impulse response serving as the left channel HRTF includes, as shown in FIG. 30, an impulse response HLd of the sound waves from the left channel speaker SPL picked up with the microphone ML (hereinafter, referred to as "impulse response of left primary component"), and an impulse response HLc of the sound waves from the left channel speaker SPL picked up with the microphone MR (hereinafter, referred to as "impulse response of left crosstalk component").

Next, an acoustic reproduction of an impulse is performed at the right channel speaker SPR in the same way, and the impulse emitted by that reproduction is picked up with each of the microphones ML and MR and an HRTF for the right channel, i.e., the HRTF of the right channel, is measured as an impulse response.

In this case, the impulse response serving as the right channel HRTF includes an impulse response HRd of the sound waves from the right channel speaker SPR picked up with the microphone MR (hereinafter, referred to as "impulse response of right primary component"), and an impulse response HRc of the sound waves from the right channel speaker SPR picked up with the microphone ML (hereinafter, referred to as "impulse response of right crosstalk component").

The impulse responses for the HRTF of the left channel and the HRTF of the right channel are convoluted, as they are, with the audio signals supplied to the acoustic reproduction drivers for the left and right channels of the headphones, respectively. That is to say, the impulse response of left primary component and impulse response of left crosstalk component, serving as the left channel HRTF obtained by measurement, are convoluted, as they are, with the left signal audio signals, and the impulse response of right primary component and impulse response of right crosstalk component, serving as the right channel HRTF obtained by measurement, are convoluted, as they are, with the right signal audio signals.

This enables sound image localization (virtual sound image localization) such that sound is perceived to be just as if it were being reproduced from speakers disposed to the left and right in front of the listener in the case or two-channel stereo audio of left and right for example, even though the acoustic reproduction is nearby the ears of the listener.

A case of two channels has been described above, but with a case of three or more channels, this can be performed in the same way by disposing speakers at the virtual sound image localization positions for each of the channels, reproducing impulses for example, measuring the HRTF for each channel, and convolute impulse responses of the HRTFs obtained by measurement as to the audio signals supplied to the drivers for the acoustic reproduction by the two channels, left and right, of the headphones.

SUMMARY OF THE INVENTION

Incidentally, when a place where measurement of an HRTF is performed is not an anechoic chamber, not only a direct wave from a perceived sound source (corresponding to a virtual sound image localization position) and but also the components of a reflected wave such as shown in a dotted line in FIG. 30 are included (without being separated) in a measured HRTF. Therefore, a measured HRTF according to the related art includes the properties of the relevant measurement place according to the shape of a chamber or place or the like where measurement has been performed, and a material such as a wall, ceiling, floor, or the like where a sound wave is reflected.

In order to eliminate properties of the room or place where measurement is performed, measuring in an anechoic chamber, where there are no reflections from the floor, ceiling, walls, and so forth, can be conceived. However, in the event of convoluting HRTFs measured in an anechoic chamber as they are into audio signals, there is a problem that virtual sound image localization and orientation are somewhat fuzzy since there is no reflected waves in the case of attempting to virtually localize a sound image.

Accordingly, with the related art, measurement of HRTF to be used as they are for convolution with audio signals is not performed in an anechoic chamber, but rather, HRTFs are measured in a room with a certain amount of reverberation. Further, there has been proposed an arrangement wherein a menu of rooms or places where the HRTFs were measured, such as a studio, hall, large room, and so forth, being presented to the user, so that the user who wants to enjoy music with virtual sound image localization can select the HRTF of a desired room or place from the menu.

However, as described above, with the related art, measurement of HRTFs is performed with not only impulse responses of direct waves from a perceived sound source position but also accompanying impulse responses from reflected waves without being able to separate the impulse response of direct waves and reflected waves, including both, so only an HRTF according to a measured place or room is obtainable, and accordingly, it has been difficult to obtain an HRTF according to a desired ambient environment or room environment, and convolute this into an audio signal. For example, it has been difficult to convolute an HRTF corresponding to a perceived listening environment into an audio signal such as where speakers are disposed in front on a vast plain which has neither walls nor obstructions thereabout.

Also, in the case of attempting to obtain an HRTF in a room having a perceived predetermined shape and inner volume, and a wall of a predetermined degree of sound absorption (corresponding to the attenuation rate of a sound wave), heretofore, there has been no way other than a method to look for or fabricate such a room, and an HRTF is measured and obtained in this room. However, in reality, it is difficult to look for or fabricate such a desired listening environment or room, and present used techniques are not sufficient to convolute an HRTF corresponding to a desired arbitrary listening environment or room environment into an audio signal.

It has been found desirable to provide a head-related transfer function convolution method and device, which enables convolution of an HRTF corresponding to a desired arbitrary listening environment or room environment to be performed, and a desired virtual sound image localization feeling to be obtained.

A head-related transfer function convolution method according to an embodiment of the present invention arranged, when an audio signal is reproduced acoustically by an electro-acoustic conversion unit disposed in a nearby position of both ears of a listener, to convolute a head-related transfer function into the audio signal, which allows the listener to listen to the audio signal such that a sound image is localized in a perceived virtual sound image localization position, the head-related transfer function convolution method including the steps of: measuring, when a sound source is disposed in the virtual sound image localization position, and a sound-collecting unit is disposed in the position of the electro-acoustic conversion unit, a direct wave direction head-related transfer function regarding the direction of a direct wave from the sound source to the sound-collecting unit, and a reflected wave direction head-related transfer function regarding the direction of selected one reflected wave or reflected wave direction head-related transfer functions regarding the directions of selected multiple reflected waves, from the sound source to the sound-collecting unit, to obtain such head-related transfer functions, separately beforehand; and convoluting the obtained direct wave direction head-related transfer function, and the reflected wave direction head-related transfer function regarding the direction of the selected one reflected wave or the reflected wave direction head-related transfer functions regarding the directions of the selected multiple reflected waves, into the audio signal.

Heretofore, as described above, integral head-related transfer functions including both of a direct wave direction head-related transfer function and reflected wave direction head-related transfer function are measured, and are convoluted into an audio signal without change, on the other hand, with the above configuration, at a head-related transfer function measuring process a direct wave direction head-related transfer function and reflected wave direction head-related transfer function are measured separately beforehand. Subsequently, the obtained direct wave direction head-related transfer function and reflected wave direction head-related transfer function are convoluted into an audio signal.

Here, the direct wave direction head-related transfer function is a head-related transfer function obtained from only a sound wave for measurement directly input to a sound-collecting unit from a sound source disposed in a perceived virtual sound image localization position, and does not include the components of a reflected wave.

Also, the reflected wave direction head-related transfer function is a head-related transfer function obtained from only a sound wave for measurement directly input to a sound-collecting unit from a perceived reflected wave direction, and does not include components reflected at whichever and input to a sound-collecting unit from a sound source in the relevant reflected wave direction.

Subsequently, in the measuring, as described above, a head-related transfer function for a direct wave, and a head-related transfer function for a reflected wave are obtained separately when a virtual sound image localization position is a sound source, but at this time, as a reflected wave direction for obtaining a reflected wave direction head-related transfer function one or multiple reflected wave directions are selected according to a perceived listening environment or room environment.

For example, in the case of assuming that a listening environment is a vast plain, there is neither surrounding walls nor ceiling, and there are only a direct wave from a sound source perceived in a virtual sound image localization position, and a sound wave reflected at the ground surface or floor from the sound source, and accordingly, a direct wave direction head-related transfer function, and a reflected wave direction head-related transfer function in the direction of a reflected wave from the ground surface or floor are obtained, and these head-related transfer functions are convoluted into an audio signal.

Also, in a case wherein a rectangular parallelepiped common room is assumed as a listening environment, as reflected waves, there are sound waves reflected at the surrounding wall, ceiling, and floor of a listener, and accordingly, the reflected wave direction head-related transfer function regarding each of the reflected wave directions is obtained, and the relevant reflected wave direction head-related transfer functions and direct wave direction head-related transfer functions are convoluted into an audio signal.

In the convoluting, corresponding convolution of the direct wave direction head-related transfer function and the reflected wave direction head-related transfer functions may be executed upon a time series signal of the audio signal from each of a start point in time to start convolution processing of the direct wave direction head-related transfer function, and a start point in time to start convolution processing of each of reflected wave direction head-related transfer functions, determined according to the path length of sound waves from the virtual sound image localization position and the position of the electro-acoustic conversion means of each of the direct waves and the reflected waves.

With the above configuration, a start point in time for starting convolution processing of a direct wave direction head-related transfer function, and a start point in time for starting convolution processing of each of a single or multiple reflected wave direction head-related transfer functions are determined according to the path lengths of sound waves from the virtual sound image localization positions of a direct wave and reflected wave to the electro-acoustic conversion unit. In this case, the path length regarding a reflected wave is determined according to a perceived listening environment or room environment.

In other words, the convolution start point in time of each of the head-related transfer functions is set according to the path lengths regarding the direct wave and reflected wave, whereby an appropriate head-related transfer function according to a perceived listening environment or room environment can be convoluted into an audio signal.

With regard to the reflected wave direction head-related transfer functions, gain may be adjusted according to an attenuation rate of sound waves at a perceived reflected portion, and the convolution is executed.

With the above configuration, in a perceived listening environment or room environment, a reflected wave direction head-related transfer function in the direction from a reflection portion which reflects a sound wave is adjusted by gain worth corresponding to an attenuation rate determined with the material or the like of the relevant reflection portion, and is convoluted into an audio signal. Thus, according to the above configuration, a head-related transfer function, wherein an attenuation rate caused by noise absorption or the like at a reflection portion of a sound wave in a perceived listening environment or room environment is taken into consideration, can be convoluted into an audio signal.

According to the above arrangements, a suitable HRTF can be convoluted into an audio signal, which corresponds to a perceived listening environment or room environment.

DESCRIPTION OF THE PREFERRED EMBODIMENTS

Figure 1:
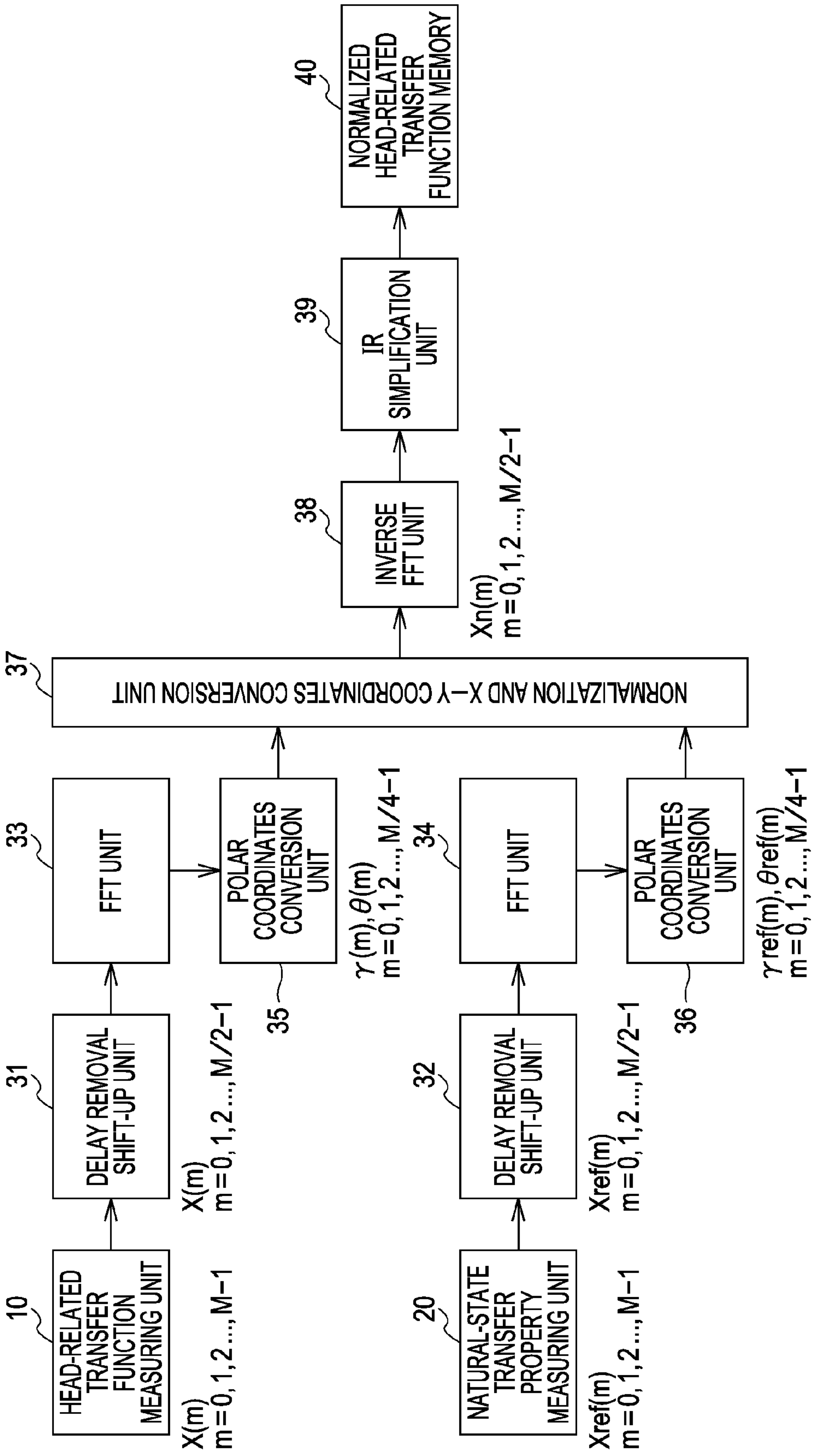
FIG. 1 is a block diagram of a system configuration example to which an HRTF (head-related transfer function) measurement method according to an embodiment of the present invention is to be applied.

Brief Overview of Embodiment of the Present Invention

As described above, with an HRTF convolution method according to the related art, an arrangement has been made wherein a speaker is disposed in a perceived sound source position to localize a virtual sound image, an HRTF is measured assuming that an impulse response caused by a reflected wave is involved instead of an impulse response caused by a direct wave from the relevant perceived sound source position being involved (assuming that impulse responses between a direct wave and reflected wave are both included without being separated), the measured and obtained HRTF is convoluted into an audio signal without change.

That is to say, heretofore, the HRTF for a direct wave and the HRTF for a reflected wave from a sound source position perceived so as to localize a virtual sound image have been measured as an integral HRTF including both without being separated.

On the other hand, with an embodiment of the present invention, the HRTF for a direct wave and the HRTF for a reflected wave from a sound source position perceived so as to localize a virtual sound image are measured separately beforehand.

Therefore, with the present embodiment, an HRTF regarding a direct wave from a perceived sound source perceived in a particular direction as viewed from a measurement point position (i.e., sound wave reaching directly the measurement point position including no reflected wave) is to be obtained. With the direction of a sound wave after being reflected off a wall or the like as a sound source direction, the HRTF for a reflected wave is measured as a direct wave from the sound source direction thereof. That is to say, in the case of considering a reflected wave which is reflected off a predetermined wall, and input to a measurement point position, the reflected sound wave from the wall after being reflected off the wall can be regarded as a direct wave of a sound wave from a sound source perceived in a reflected position direction at the relevant wall.

Accordingly, with the present embodiment, when measuring an HRTF for a direct wave from a sound source position perceived so as to localize a virtual sound image, an electro-acoustic converter serving as a measuring sound wave generating unit, e.g., speaker is disposed in the perceived sound source position so as to localize the relevant virtual sound image, but when measuring an HRTF for a reflected wave from a sound source position perceived so as to localize a virtual sound image, an electro-acoustic converter serving as a measuring sound wave generating unit, e.g., speaker is disposed in the incident direction to the measurement point position of a reflected wave to be measured.

Accordingly, an HRTF regarding reflected waves from various directions is measured by disposing an electro-acoustic converter serving as a measuring sound wave generating unit in the incident direction to the measurement point position of each reflected wave.

Subsequently, with the present embodiment, HRTFs regarding a direct wave and reflected waves thus measured are convoluted into an audio signal, thereby obtaining virtual sound image localization within target reproduction acoustic space, but with regard to HRTFs for reflected waves, only a reflected wave in a direction selected according to the target reproduction acoustic space is convoluted into an audio signal.

Also, with the present embodiment, HRTFs regarding a direct wave and reflected waves are measured by removing propagation delay worth corresponding to the path length of a sound wave from a measuring sound source position to a measurement point position, and at the time of performing processing for convoluting each of the HRTFs into an audio signal, the propagation delay worth corresponding to the path length of a sound wave from a measuring sound source position (virtual sound image localization position) to a measurement point position (acoustic reproduction unit position) is taken into consideration.

Thus, an HRTF regarding a virtual sound image localization position arbitrarily set according to the size of a room or the like can be convoluted into an audio signal.

Subsequently, properties such as the degree of reflection, degree of sound absorption, or the like due to the material of a wall or the like relating to the attenuation rate of a reflected sound wave are perceived as the gain of a direct wave from the relevant wall. That is to say, with the present embodiment, for example, an HRTF according to a direct wave from a perceived sound source position to a measurement point position is convoluted into an audio signal without attenuation, and also with regard to reflected sound wave components from the wall, an HRTF according to a direct wave from a sound source perceived in the reflected position direction of the wall thereof is convoluted with an attenuation rate according to the degree of reflection or degree of sound absorption corresponding to the properties of the wall.

The reproduction sound of an audio signal into which an HRTF is thus convoluted is listened to, whereby verification can be made whether to obtain what type of a virtual sound image localization state according to the degree of reflection or degree of sound absorption corresponding to the properties of the wall.

Also, acoustic reproduction from convolution in audio signals of HRTFs of direct waves and HRTFs of selected reflected waves, taking into consideration the attenuation rate, enables simulation of virtual sound image localization in various room environments and place environments. This can be realized by separating a direct wave and reflected waves from the perceived sound source position, and measuring as HRTFs.

Description of HRTF Measurement Method

As described above, HRTFs regarding a direct wave from which the reflected wave components have been eliminated can be obtained by measuring in an anechoic chamber, for example.

Accordingly, with an anechoic chamber, HRTFs are measured regarding a direct wave from a desired virtual sound image localization position, and perceived multiple reflected waves, and are employed for convolution.

That is to say, with an anechoic chamber, HRTFs are measured by disposing a microphone serving as an acousto-electric conversion unit for collecting a sound wave for measurement in a measurement point position in the vicinity of both ears of a listener, and also disposing a sound source for generating a sound wave for measurement in the positions of the directions of the direct wave and multiple reflected waves.

Incidentally, even if HRTFs are obtained within an anechoic chamber, the properties of speaker and microphone of a measuring system for measuring an HRTF are not eliminated, which causes a problem wherein the HRTFs measured and obtained have been affected by the properties of the speaker and microphone employed for measurement.

In order to eliminate the effects of properties of the microphones and speakers, using expensive microphones and speakers having excellent properties with flat frequency properties as the microphones and speakers used for measuring the HRTFs. However, even such expensive microphones and speakers do not yield ideally flat frequency properties, so there have been cases wherein the effects of the properties of such microphones and speakers could not be completely eliminated, leading to deterioration in the sound quality of the reproduced audio.

Also, eliminating the properties of the microphones and speakers can be conceived by correcting audio signals following convolution of the HRTFs, using inverse properties of the measurement system microphones and speakers, but in this case, there is the problem that a correction circuit has to be provided to the audio signal reproduction circuit, so the configuration becomes complicated, and also correction complete eliminating the effects of the measurement system is difficult.

In order to eliminate the influence of a room or place for measurement in light of the above-mentioned problems, with the present embodiment, HRTFs are measured within an anechoic chamber, and also in order to eliminate the influence of the properties of a microphone and speaker employed for measurement, the HRTFs measured and obtained are subjected to normalization processing such as described below. First, an embodiment of the HRTF measurement method according to the present embodiment will be described with reference to the drawings.

FIG. 1 is a block diagram of a configuration example of a system for executing processing procedures for obtaining data for a normalized HRTF used with the HRTF measurement method according to an embodiment of the present invention. With this example, an HRTF measurement unit 10 performs measurement of HRTFs in an anechoic chamber, in order to measure head-related transfer properties of direct waves alone. With the HRTF measurement unit 10, in the anechoic chamber, a dummy head or an actual human serving as the listener is situated at the position of the listener, and microphones serving as an acousto-electric conversion unit for collecting sound waves for measurement are situated at positions (measurement point positions) nearby both ears of the dummy head or human, where an electro-acoustic conversion unit for performing acoustic reproduction of audio signals in which the HRTFs have been convoluted are placed.

In a case where the electro-acoustic conversion unit for performing acoustic reproduction of audio signals in which the HRTFs have been convoluted are headphones with two channels of left and right for example, a microphone for the left channel is situated at the position of the headphone driver of the left channel, and a microphone for the right channel is situated at the position of the headphone driver of the right channel.

Subsequently, a speaker serving as an example of a measurement sound source is situated at one of the directions regarding which an HRTF is to be measured, with the listener or microphone position serving as a measurement point position as a basing point. In this state, measurement sound waves for the HRTF, impulses in this case, are reproduced from this speaker, and impulse responses are picked up with the two microphones. Note that in the following description, a position in a direction regarding which an HRTF is to be measured, where the speaker for the measurement sound source is placed, will be referred to as a "perceived sound source position".

With the HRTF measurement unit 10, the impulse responses obtained from the two microphones represent HRTFs. With this embodiment, the measurement at the HRTF measurement unit 10 corresponds to a first measuring.

With a natural-state transfer property measurement unit 20, measurement of natural-state transfer properties is performed under the same environment as with the HRTF measurement unit 10. That is to say, with this example, the transfer properties are measured in a nature state wherein there is neither the human nor the dummy head at the listener's position, i.e., there is no obstacles between a measurement source position and a measurement point position.

Specifically, with the natural-state transfer property measurement unit 20, the dummy head or human situated with the HRTF measurement unit 10 in the anechoic chamber is removed, a natural state with no obstacles between the speakers which are the perceived sound source position and the microphones is created, and with the placement of the speakers which are the perceived sound source position and the microphones being exactly the same state as with the HRTF measurement unit 10, in this state, measurement sound waves, impulses in this example, are reproduced by perceived sound source position speakers, and the impulse responses are picked up with the two microphones.

The impulse responses obtained form the two microphones with the natural-state transfer property measurement unit 20 represent natural-state transfer properties with no obstacles such as the dummy head or human.

Note that with the HRTF measurement unit 10 and the natural-state transfer property measurement unit 20, the above-described HRTFs and natural-state transfer properties for the left and right primary components, and HRTFs and natural-state transfer properties for the left and right crosstalk components, are obtained from each of the two microphones. Later-described normalization processing is performed for each of the primary components and left and right crosstalk components. In the following description, normalization processing will be described regarding only the primary components for example, and description of normalization processing regarding the crosstalk components will be omitted, to facilitate description. Of course, normalization processing is performed in the same way regarding the crosstalk components, as well.

The impulse responses obtained with the HRTF measurement unit 10 and the natural-state transfer property measurement unit 20 are output of digital data of 8,192 samples at a sampling frequency of 96 kHz with this example.

Now, the data of the HRTF obtained from the HRTF measurement unit 10 is presented as X(m), where m=0, 1, 2 . . . , M−1 (M=8192), and data of the natural-state transfer property obtained from the natural state transfer property measurement unit 20 is presented as Xref(m), where m=0, 1, 2 . . . , M−1 (M=8192).

The HRTF data X(m) from the HRTF measurement unit 10 and the natural-state transfer property data Xref(m) from the natural-state transfer property measurement unit 20 are subjected to removal of data of the head portion from the point in time at which reproduction of impulses was started at the speakers, by an amount of delay time equivalent to the arrival time of sound waves from the speaker at the perceived sound source position to the microphones for obtaining pulse responses, by delay removal shift-up units 31 and 32, and also at the delay removal shift-up units 31 and 32 the number of data is reduced to a number of data of a power of two, such that orthogonal transform from time-axial data to frequency-axial data can be performed next downstream.

Next, the HRTF data X(m) and the natural-state transfer property data Xref(m), of which the number of data has been reduced at the delay removal shift-up units 31 and 32, are supplied to FFT (Fast Fourier Transform) units 33 and 34 respectively, and transformed from time-axial data to frequency-axial data. Note that with the present embodiment, the FFT units 33 and 34 perform Complex Fast Fourier Transform (Complex FFT) which takes into consideration the phase.

Due to the complex FFT processing at the FFT unit 33, the HRTF data X(m) is transformed to FFT data made up of a real part R(m) and an imaginary part jI(m), i.e., R(m)+jI(m).

Also, due to the complex FFT processing at the FFT unit 34, the natural-state transfer property data Xref(m) is transformed to FFT data made up of a real part Rref(m) and an imaginary part jIref(m), i.e., Rref(m)+jIref(m).

The FFT data obtained from the FFT units 33 and 34 are X-Y coordinate data, and with this embodiment, further polar coordinates conversion units 35 and 36 are used to convert the FFT data into polar coordinates data. That is to say, the HRTF FFT data R(m)+jI(m) is converted by the polar coordinates conversion unit 35 into a radius γ(m) which is a size component, and an amplitude θ(m) which is an angle component. The radius γ(m) and amplitude θ(m) which are the polar coordinates data are sent to a normalization and X-Y coordinates conversion unit 37.

Also, the natural-state transfer property FFT data Rref(m)+jIref(m) is converted by the polar coordinates conversion unit 35 into a radius γref(m) and an amplitude θref(m). The radius γref(m) and amplitude θref(m) which are the polar coordinates data are sent to the normalization and X-Y coordinates conversion unit 37.

At the normalization and X-Y coordinates conversion unit 37, first, the HRTF measured including the dummy head or human is normalized using the natural-state transmission property where there is no obstacle such as the dummy head. Specific computation of the normalization processing is as follows.

With the radius following normalization as γn(m) and the amplitude following normalization as θn(m), $$\gamma n(m)=\gamma(m)/\gamma \mathrm{ref}(m)$$

$$\theta n(m)=\theta(m)/\theta \mathrm{ref}(m) \quad \text{(Expression 1)}$$

holds.

Subsequently, at the normalization and X-Y coordinates conversion unit 37, the polar coordinate system data following normalization processing, the radius γn(m) and the amplitude θn(m), is converted into normalized HRTF data of frequency-axial data of the real part Rn(m) and imaginary part jIn(m) (m=0, 1 . . . M/4−1) of the X-Y coordinate system.

The normalized HRTF data of the frequency-axial data of the X-Y coordinate system is transformed into impulse response Xn(m) which is normalized HRTF data of the time-axis at an inverse FFT unit 38. The inverse FFT unit 38 performs Complex Inverse Fast Fourier Transform (Complex Inverse FFT).

That is to say, computation of $$Xn(m)=\mathrm{IFFT}(Rn(m)+jIn(m))$$

where m=0, 1, 2 . . . M/2−1, is performed at the Inverse FFT (IFFT (Inverse Fast Fourier Transform)) unit 38, which obtains the impulse response Xn(m) which is time-axial normalized HRTF data.

The normalized HRTF data Xn(m) from the inverse FFT unit 38 is simplified to impulse property tap length which can be processed (which can be convoluted, described later), at an IR (impulse response) simplification unit 39. With this embodiment, this is simplified to 600 taps (600 pieces of data from the head of the data from the inverse FFT unit 38).

The normalized HRTF data Xn(m) (m=0, 1 . . . 599) simplified at the IR simplification unit 39 is written to the normalized HRTF memory 40 for later-described convolution processing. Note that the normalized HRTF written to this normalized HRTF memory 40 includes a normalized HRTF which is a primary component, and a normalized HRTF which is a crosstalk function, at each of the perceived sound source positions (virtual sound image localization positions), as described earlier.

The description above has been description regarding processing for obtaining normalized HRTFs as to a speaker position in a case where a speaker for reproducing impulses as an example of measurement sound waves is situated at one perceived sound source position separated from a microphone position with a measurement point position by a predetermined distance, in one particular direction as to a listener position.

With this embodiment, the perceived sound source position, which is the position at which the speaker for reproducing the impulses serving as the example of a measuring sound wave is positioned, is changed variously in different directions as to the measurement point position, with a normalized HRTF being obtained for each perceived sound source position.

That is to say, with the present embodiment, HRTFs are obtained regarding not only a direct wave but also reflected waves from a virtual sound image localization position, and accordingly, a virtual sound source position is set to multiple positions in light of the incident direction to measurement point positions for reflected waves, thereby obtaining normalized HRTFs thereof.

Now, the perceived sound source position which is the speaker placement position is changed in increments of 10 degrees at a time for example, which is a resolution for a case of taking into consideration the direction of a reflected wave direction to be obtained, over an angular range of 360 degrees or 180 degrees center on the microphone position or listener which is the measurement position, within a horizontal plane, to obtain normalized HRTFs regarding reflected waves from both side walls of the listener.

Similarly, the perceived sound source position which is the speaker placement position is changed in increments of 10 degrees at a time for example, which is a resolution for a case of taking into consideration the direction of a reflected wave direction to be obtained, over an angular range of 360 degrees or 180 degrees center on the microphone position or listener which is the measurement position, within a vertical plane, to obtain a normalized HRTF regarding a reflected wave from the ceiling or floor.

A case of taking into consideration an angular range of 360 degrees is a case wherein there is a virtual sound image localization position serving as a direct wave behind the listener, for example, a case assuming reproduction of multi-channel surround-sound audio such as 5.1 channels, 6.1 channels, 7.1 channels, and so forth, and also a case of taking into consideration a reflected wave from the wall behind the listener. A case of taking into consideration an angular range of 180 degrees is a case assuming that the virtual sound image localization position is only in front of the listener, or a state where there are no reflected waves from a wall behind the listener.

Also, with this embodiment, the position where the microphones are situated is changed in the measurement method of the HRTF and natural-state transfer property at the HRTF measurement units 10 and 20, in accordance with the position of acoustic reproduction drivers such as the drivers of the headphones actually supplying the reproduced sound to the listener.

Figure 2A:
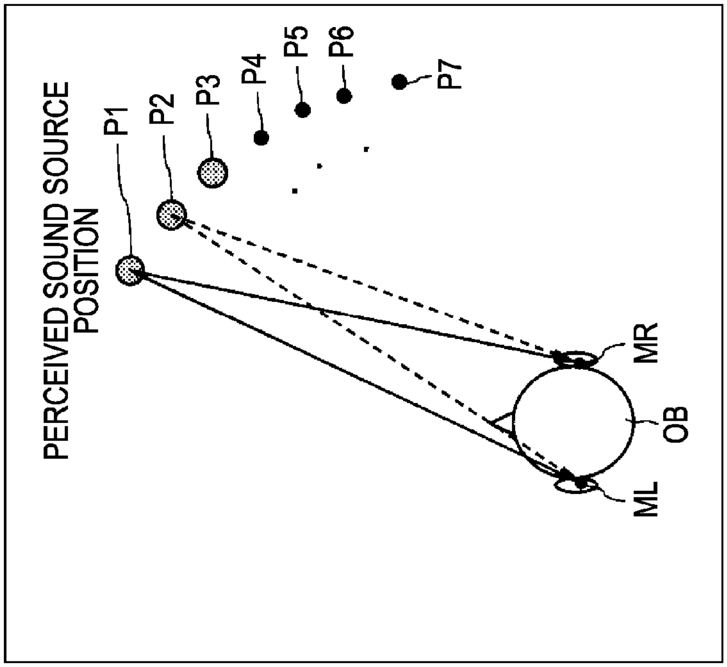
FIGS. 2A and 2B are diagrams for describing HRTF and natural-state transfer property measurement positions with the HRTF measurement method according to an embodiment of the present invention.
Figure 2B:
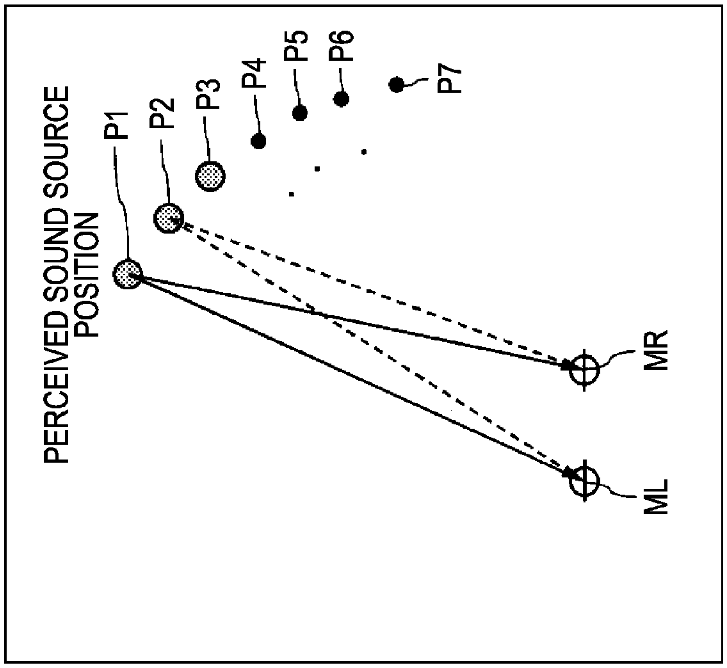

FIGS. 2A and 2B are diagrams for describing HRTF and natural-state transfer property measurement positions (perceived sound source positions) and microphone placement positions serving as measurement point positions, in a case wherein the acoustic reproduction unit serving as electro-acoustic conversion unit for actually supplying the reproduced sound to the listener are inner headphones.

Specifically, FIG. 2A illustrates a measurement state with the HRTF measurement unit 10 where the acoustic reproduction unit for supplying the reproduced sound to the listener are inner headphones, with a dummy head or human OB situated at the listener position, and with the speaker for reproducing impulses at the perceived sound source positions being situated at predetermined positions in the direction regarding which HRTFs are to be measured, at 10 degree intervals, centered on the listener position or the center position of the two driver positions of the inner headphones, in this example, as indicated by dots P1, P2, P3, . . . .

Also, with this example of the case of the inner headphones, the two microphones ML and MR are situated at positions within the auditory capsule positions of the ears of the dummy head or human, as shown in FIG. 2A.

FIG. 2B shows a measurement environment state wherein the dummy head or human OB in FIG. 2A has been removed, illustrating a measurement state with the natural-state transfer property measurement unit 20 where the electro-acoustic conversion unit for supplying the reproduced sound to the listener are inner headphones.

The above-described normalization processing is carried out by normalizing HRTFs measured at each of the perceived sound source positions indicated by dots P1, P2, P3, . . . in FIG. 2A, with the natural-state transfer properties measured in FIG. 2B at the same perceived sound source positions indicated by dots P1, P2, P3, . . . as with FIG. 2B, respectively. For example, an HRTF measured at the perceived sound source position P1 is normalized with the natural-state transfer property measured at the same perceived sound source position P1.

Figure 3:
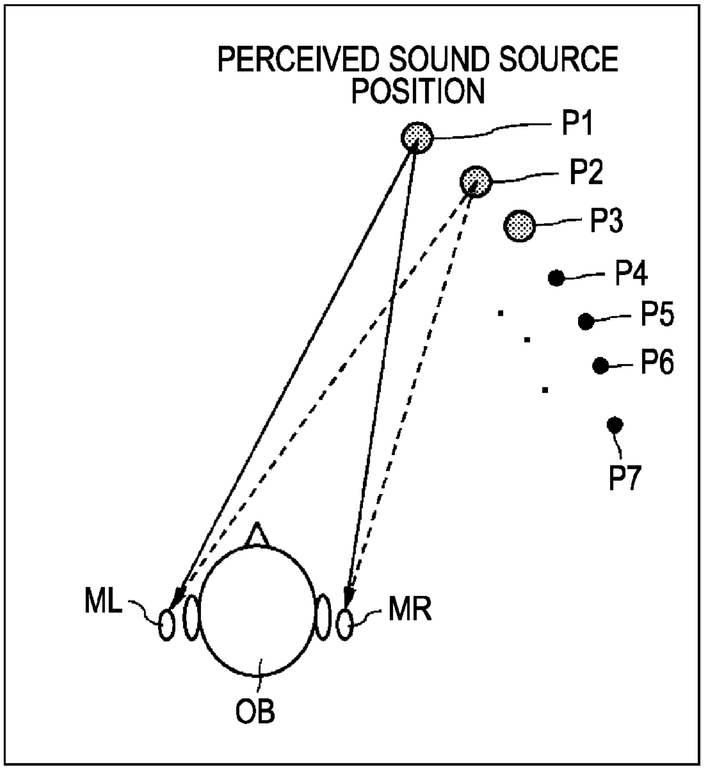
FIG. 3 is a diagram for describing the measurement position of HRTFs in the HRTF measurement method according to an embodiment of the present invention.

Next, FIG. 3 is a diagram for describing the perceived sound source position and microphone placement position at the time of measuring HRTFs and natural-state transfer properties in the case that the acoustic reproduction unit for supplying the reproduced sound to the listener is over-head headphones. With the over-head headphones of the example in FIG. 3, the one headphone driver each is provided for both ears, respectively.

More specifically, FIG. 3 illustrates a measurement state with the HRTF measurement unit 10 where the acoustic reproduction unit for supplying the reproduced sound to the listener are over-head headphones, with a dummy head or human OB being positioned at the listener position, and with the speaker for reproducing impulses at the perceived sound source positions being situated at perceived sound source positions in the direction regarding which HRTFs are to be measured, at 10 degree intervals, centered on the listener position or the center position of the two driver positions of the over-head headphones, in this example, as indicated by dots P1, P2, P3, . . . . Also, the two microphones ML and MR are situated at positions nearby the ears facing the auditory capsules of the ears of the dummy head or human, as shown in FIG. 3.

The measurement state at the natural-state transfer property measurement unit 20 in the case that the acoustic reproduction unit is over-head headphones is a measurement environment wherein the dummy head or human OB in FIG. 3 has been removed. In this case as well, it is needless to say that measurement of the HRTFs and natural-state transfer properties, and the normalization processing, are performed in the same way as with FIGS. 2A and 2B.

Figure 4:
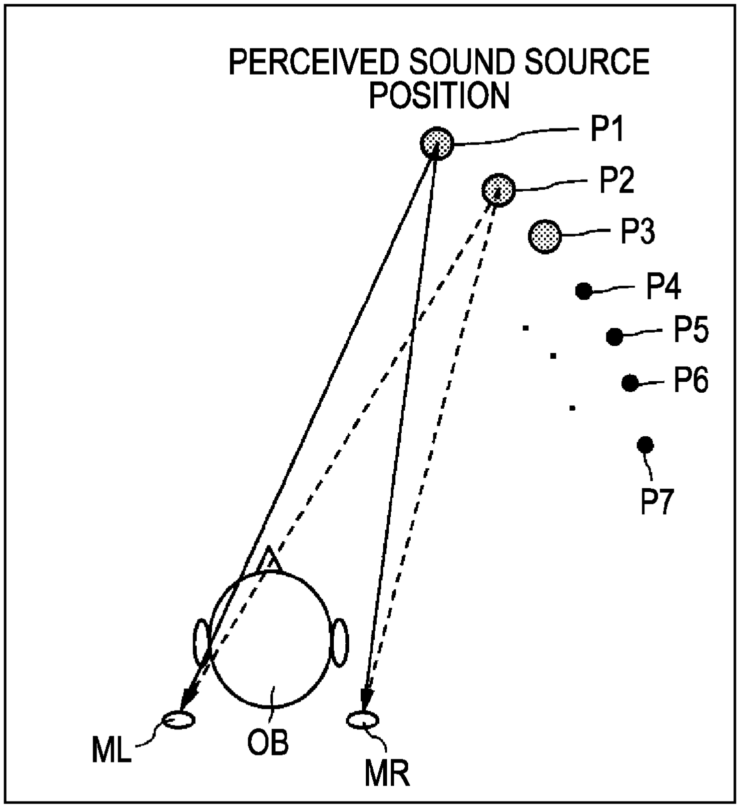
FIG. 4 is a diagram for describing the measurement position of HRTFs in the HRTF measurement method according to an embodiment of the present invention.

Next, FIG. 4 is a diagram for describing the perceived sound source position and microphone placement position at the time of measuring HRTFs and natural-state transfer properties in the case of placing electro-acoustic conversion unit serving as acoustic reproduction unit for supplying the reproduced sound to the listener, speakers for example, in a headrest portion of a chair in which the listener sits, for example. With the example in FIG. 4, an HRTF and natured-state transfer properties are measured in a case wherein two speakers are disposed on the left and right behind the head of a listener, and acoustic reproduction is performed.

More specifically, FIG. 4 illustrates a measurement state with the HRTF measurement unit 10 where the acoustic reproduction unit for supplying the reproduced sound to the listener are speakers positioned in a headrest portion of a chair, with a dummy head or human OB being positioned at the listener position, and with the speaker for reproducing impulses at the perceived sound source positions being situated at perceived sound source positions in the direction regarding which HRTFs are to be measured, at 10 degree intervals, centered on the listener position or the center position of the two speaker positions placed in the headrest portion of the chair, in this example, as indicated by dots P1, P2, P3, . . . .

Also, as shown in FIG. 4, the two microphones ML and MR are situated at positions behind the head of the dummy head or human and nearby the ears of the listener, which is equivalent to the placement positions of the two speakers attached to the headrest of the chair.

The measurement state at the natural-state transfer property measurement unit 20 in the case that the acoustic conversion reproduction unit is electro-acoustic conversion drivers attached to the headrest of the chair is a measurement environment wherein the dummy head or human OB in FIG. 4 has been removed. In this case as well, it is needless to say that measurement of the HRTFs and natural-state transfer properties, and the normalization processing, are performed in the same way as with FIGS. 2A and 2B.

Figure 5:
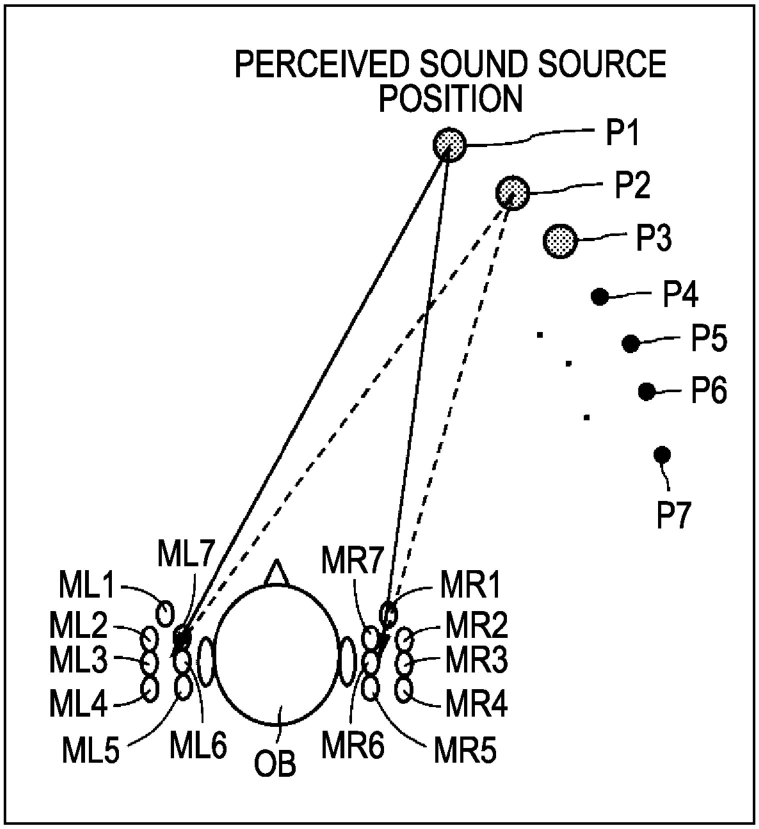
FIG. 5 is a block diagram illustrating a configuration of a reproduction device to which the HRTF convolution method according an embodiment of to the present invention has been applied.

Next, FIG. 5 is a diagram for describing a perceived sound source position and microphone installation position when measuring an HRTF and nature-stated transfer properties in a case wherein an acoustic reproduction unit for supplying reproduction sound to a listener is over-head headphones in which seven headphone driver units each are disposed as to each of both ears as over-head headphones for 7.1 channel multi-surround. With the example in FIG. 5, seven microphones ML1, ML2, ML3, ML4, ML5, ML6, and ML7, and seven microphones MR1, MR2, MR3, MR4, MR5, MR6, and MR7 are disposed in the corresponding seven headphone drivers for the left ear and seven headphone drivers for the right ear, facing the left ear and right ear of the listener, respectively.

Subsequently, speakers for reproducing impulses are disposed in perceived sound source positions in directions desired to measure an HRTF, for example, for each 10 degrees interval with the listener position or the center position of the seven microphones as the center, such as shown in circles P1, P2, P3, and so on, in the same way as with the above-mentioned case.

Subsequently, an impulse serving as a sound wave for measurement reproduced with the speaker in each perceived sound source position is sound-collected at each of the microphones ML1 through ML7 and MR1 through MR7, respectively. Subsequently, in a state in which there is a dummy head or person in the listener position, an HRTF is obtained from each of the output audio signals of the microphones ML1 through ML7, and MR1 through MR7. Also, in a natured state in which there is neither dummy head nor person, natured-state transfer properties are obtained from each of the output audio signals of the microphones ML1 through ML7, and MR1 through MR7. Subsequently, as described above, a normalized HRTF is each obtained from the HRTF and natured-state transfer properties, and is stored in a normalized HRTF memory 40.

In the case of the example in FIG. 5, a normalized HRTF to be convoluted into an audio signal which each of the microphones supplies to the corresponding headphone driver unit is obtained from each of the output audio signals of the microphones ML1 through ML7, and MR1 through MR7 at the time of localizing a virtual sound image in each perceived sound source direction position.

From the above, impulse responses from a virtual sound source position are measured in an anechoic chamber, for example, at 10 degree intervals, centered on the center position of the head of the listener or the center position of the electro-acoustic conversion unit for supplying audio to the listener at the time of reproduction, as shown in FIGS. 2A through 5, so HRTFs can be obtained regarding only a direct wave from the respective virtual sound image localization positions, with reflected waves having been eliminated.

The obtained normalized HRTFs have properties of speakers generating the impulses and properties of the microphones picking up the impulses eliminated by normalization processing.

Further, the obtained normalized HRTFs have had a delay removed which corresponds to the distance between the position of speaker generating the impulses (perceived sound source position) and position of microphones for picking up the impulses (assumed driver positions), so this is irrelevant to the distance between the position of speaker generating the impulses (perceived sound source position) and position of microphones for picking up the impulses (assumed driver positions). That is to say, the obtained normalized HRTFs are HRTFs corresponding to only the direction of the speaker generating the impulses (perceived sound source position) as viewed from the position of microphones for picking up the impulses (assumed driver positions).

Accordingly, at the time of convolution of the normalized HRTF in the audio signals, providing a delay to the audio signals corresponding to the distance between the virtual sound source position and the assumed driver position enables acoustic reproduction with the distance position corresponding to the delay in the direction of the perceived sound source position as to the assumed driver positions as a virtual sound image localization position. With reflected waves from the direction of the perceived sound source position, this can be achieved by providing the audio signals with a delay corresponding to the path length of sound waves from the position at which virtual sound image localization is desired, reflected off of reflection portions such as walls or the like, and input to the assumed driver position from the perceived sound source position.

That is to say, in the case of convoluting a normalized HRTF into an audio signal regarding a direct wave and reflected waves, the audio signal is subjected to delay corresponding to the path length of a sound wave to be input from a desired virtual sound image localization position to a perceived driver position.

Note that signal processing in the block diagram in FIG. 1 for describing an embodiment of the HRTF measurement method can be all performed by a DSP (Digital Signal Processor). In this case, the obtaining units of the HRTF data X(m) and natural-state transfer property data Xref(m) of the HRTF measurement unit 10 and natural-state transfer property measurement unit 20, the delay removal shift-up units 31 and 32, the FFT units 33 and 34, the polar coordinates conversion units 35 and 36, the normalization and X-Y coordinates conversion unit 37, the inverse FFT unit 38, and the IR simplification unit 39, can each be configured a DSP, or the entire signal processing can be configured of a single or multiple DSPs.

Note that with the example in FIG. 1 described above, data of HRTFs and natural-state transfer properties is subjected to removal of head data of an amount of delay time corresponding to the distance between the perceived sound source position and the microphone position at the delay removal shift-up units 31 and 32, in order to reduce the amount of processing regarding later-described convolution for the HRTFs, whereby data following that removed is shifted up to the head, and this data removal processing is performed using memory within the DSP, for example. However, in cases wherein this delay-removal shift-up can be done without, the DSP may perform processing of the original data with the unaltered 8,192 samples of data.

Also, the IR simplification unit 39 is for reducing the amount of convolution processing at the time of the later-described convolution processing of the HRTFs, and accordingly this can be omitted.

Further, in the above-described embodiment, the reason that the frequency-axial data of the X-Y coordinate system from the FFT units 33 and 34 is converted into frequency data of a polar coordinate system is taking into consideration cases where normalization processing does not work in the state of frequency data of the X-Y coordinate system, so with an ideal configuration, normalization processing can be performed with frequency data of the X-Y coordinate system as it is.

Note that with the above-described example, normalized HRTFs are obtained regarding a great number of perceived sound source positions, assuming various virtual sound image localization positions and the perceived driver positions of the incident directions of the reflected waves thereof. The reason why normalized HRTFs regarding the multiple perceived sound source positions have been thus obtained is for enabling an HRTF in the direction of an employed perceived sound source position to be selected therefrom later. However, it goes without saying that in a case wherein a virtual sound source localization position is fixed beforehand, and the incident direction of a reflected wave is determined beforehand, normalized HRTFs as to the fixed virtual sound image localization position and the perceived sound source position in the incident direction of a reflected wave may be obtained.

Now, while measurement is performed in an anechoic chamber in the above-described embodiment in order to measure the HRTFs and natural-state transfer properties regarding only the direct waves from multiple perceived sound source positions, but direct wave components can be extracted even in rooms with reflected waves rather than an anechoic chamber, if the reflected waves are greatly delayed as to the direct waves, by applying a time window to the direct wave components.

Also, by using TSP (Time Stretched Pulse) signals instead of impulses for the measurement sound waves for HRTFs emitted by the speaker at the perceived sound source positions, reflected waves can be eliminated and HRTFs and natural-state transfer properties can be measured regarding direct waves alone even if not in an anechoic chamber.

Verification of Advantages of Employing Normalized HRTF

Figure 6A:
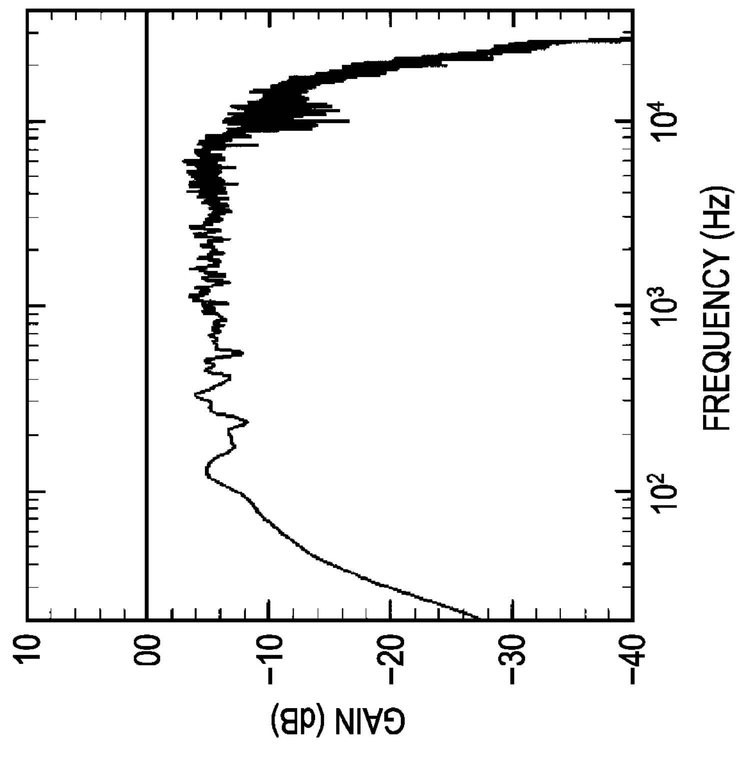
FIGS. 6A and 6B are diagrams illustrating an example of properties of measurement result data obtained by an HRTF measurement unit and a natural-state transfer property measurement unit with an embodiment of the present invention.
Figure 6B:
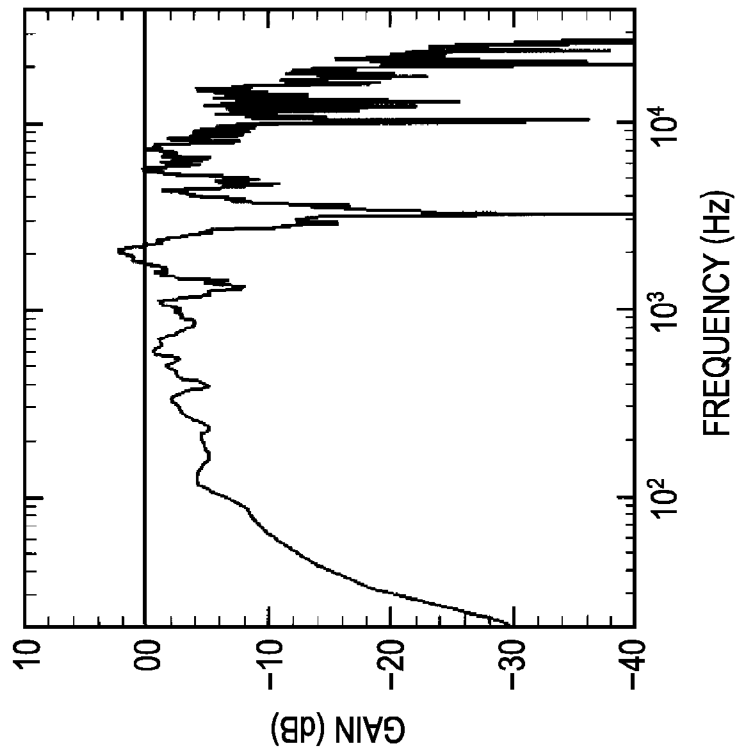

FIGS. 6A and 6B show properties of a measurement system including speakers and microphones actually used for HRTFs measurement. FIG. 6A illustrates frequency properties of output signals from the microphones when sound of frequency signals from 0 to 20 kHz is reproduced at a same constant level by the speaker in a state where an obstacle such as the dummy head or human is not inserted, and picked up with the microphones.

The speaker used here is an industrial-use speaker which is supposed to have quite good properties, but even then properties as shown in FIG. 6A are exhibited, and flat frequency properties are not obtained. Actually, the properties shown in FIG. 6A are recognized as being excellent properties, belonging to a fairly flat class of general speakers.

With the related art, the properties of the speaker and microphones are added to the HRTF, and are not removed, so the properties and sound quality of the sound obtained with the HRTFs convoluted are effected of the properties of the speaker of and microphones.

FIG. 6B illustrates frequency properties of output signals from the microphones in a state that an obstacle such as a dummy head or human is inserted under the same conditions. It can be sent that there is a great dip near 1200 Hz and near 10 kHz, illustrating that the frequency properties change greatly.

Figure 7B:
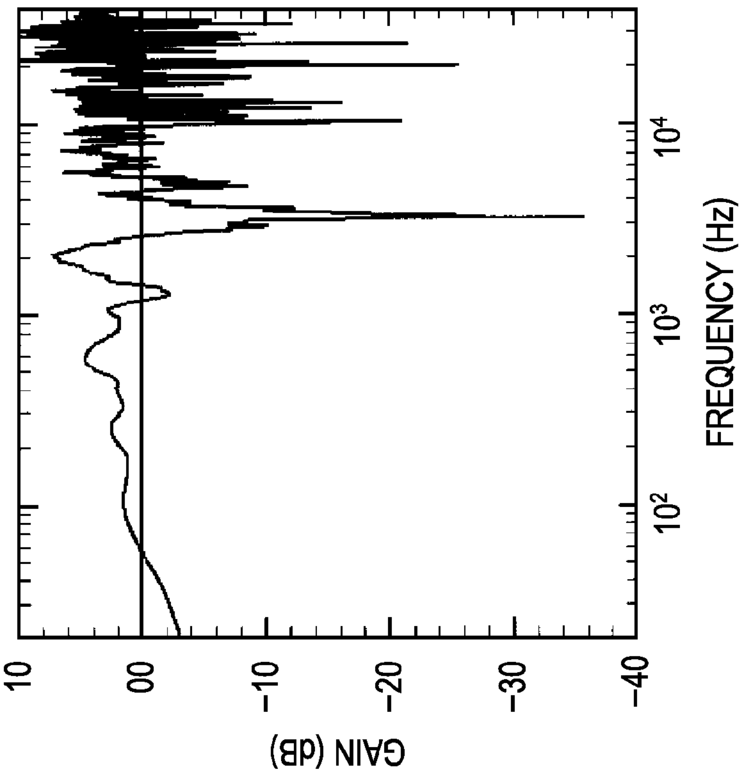
FIGS. 7A and 7B are diagrams illustrating an example of properties of normalized HRTFs obtained by an embodiment of the present invention.
Figure 7A:
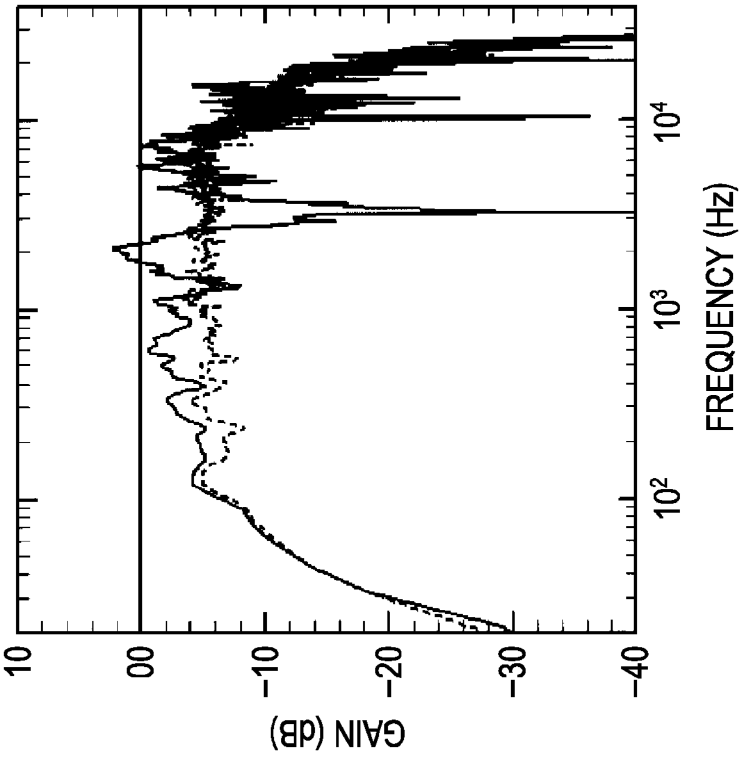

FIG. 7A is a frequency property diagram illustrating the frequency properties of FIG. 6A and the frequency properties of FIG. 6B overlaid. On the other hand, FIG. 7B illustrates normalized HRTF properties according to the embodiment described above. It can be sent form this FIG. 7B that gain does not drop with the normalized HRTF properties, even in the lowband.

With the embodiment according to the present invention described above, complex FFT processing is performed, and normalized HRTFs are used taking into consideration the phase component, so the normalized HRTFs are higher in fidelity as compared to cases of using HRTFs normalized only with the amplitude component.

Figure 8:
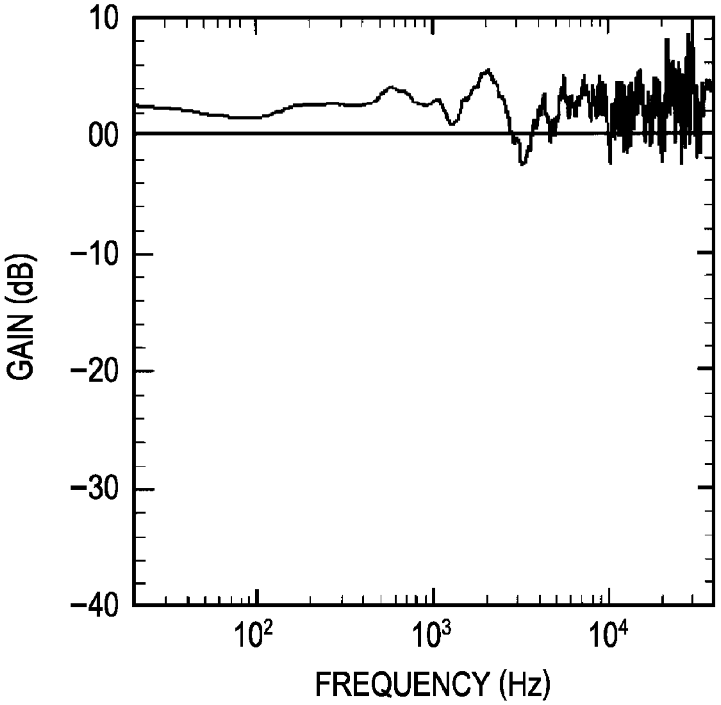
FIG. 8 is a diagram illustrating an example of properties to be compared with properties of normalized HRTFs obtained by an embodiment of the present invention.

An arrangement wherein processing for normalizing the amplitude alone without taking into consideration the phase is performed, and the impulse properties remaining at the end are subjected to FFT again to obtain properties, is shown in FIG. 8. As can be understood by comparing this FIG. 8 with FIG. 7B which is the properties of the normalized HRTF according to the present embodiment, the difference in property between the HRTF X(m) and natural-state transfer property Xref(m) is correctly obtained with the complex FFT as shown in FIG. 7B, but in a case of not taking the phase into consideration, this deviates from what it should be, as shown in FIG. 8.

Also, in the processing procedures in FIG. 1 described above, the IR simplification unit 39 performs simplification of the normalized HRTFs at the end, so deviation of properties is less as compared to a case where the number of data is reduced from the beginning.

Figure 9:
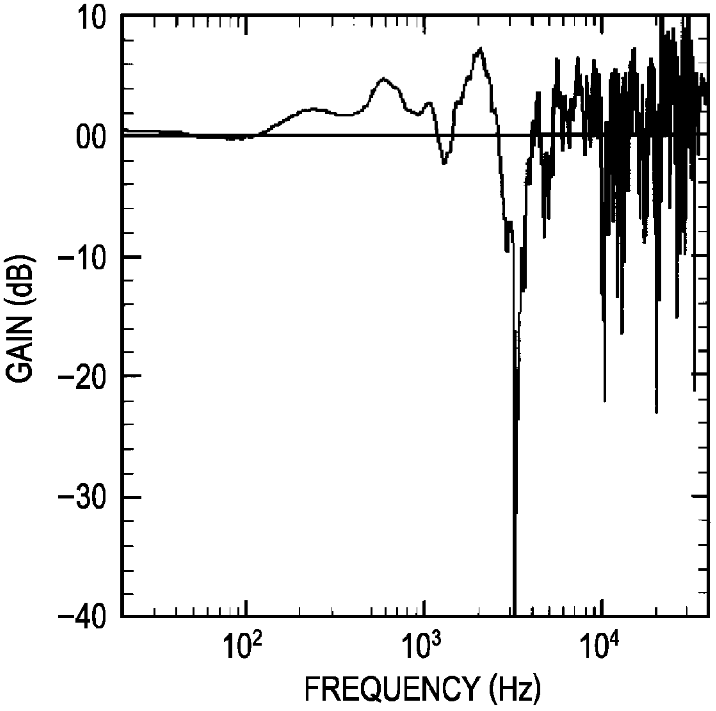
FIG. 9 is a diagram illustrating an example of properties to be compared with properties of normalized HRTFs obtained by an embodiment of the present invention.

That is to say, in the event of performing simplification for reducing the number of data first for the data obtained with the HRTF measurement unit 10 and natural-state transfer property measurement unit 20 (case of performing normalization with those following the number of impulses used at the end as 0), the properties of the normalized HRTFs are as shown in FIG. 9, with particular deviation in lowband properties. On the other hand, the properties of the normalized HRTFs obtained with the configuration of the embodiment described above are as shown in FIG. 7B, with little deviation even in lowband properties.

Description of HRTF Convolution Method

Figure 10:
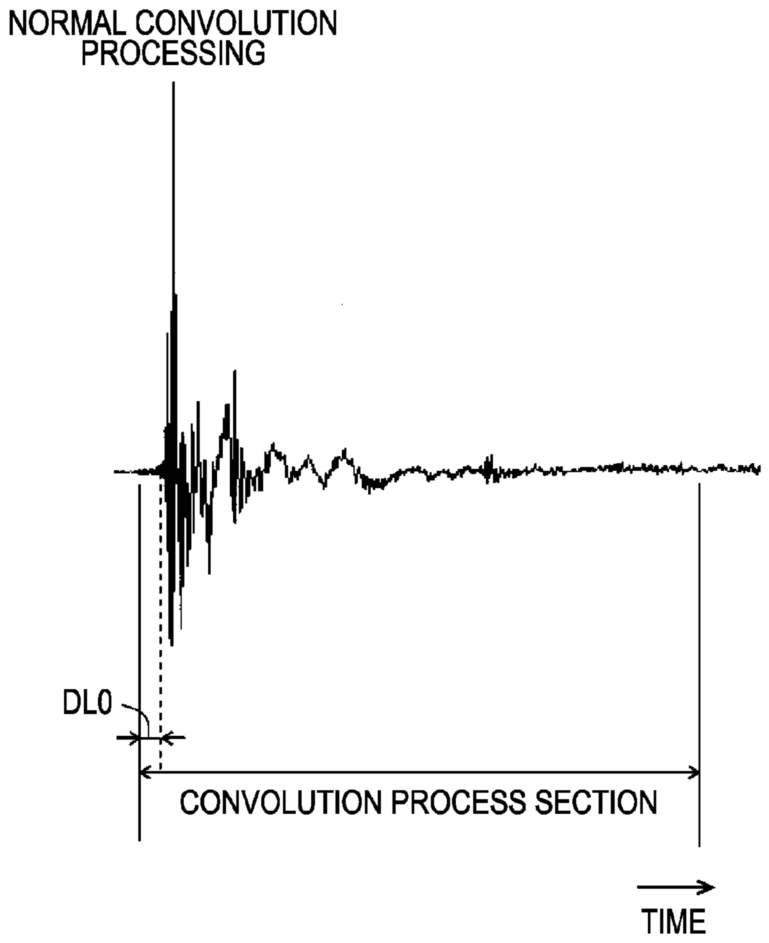
FIG. 10 is a diagram for describing a convolution process section of a common HRTF according to the related art.

FIG. 10 illustrates an impulse response serving as an example of an HRTF obtained by a measurement method according to the related art, which is an integral response including a direct wave as well as all of the reflected wave components. Heretofore, as shown in FIG. 10, the entirety of an integral impulse response including a direct wave and all of the reflected waves is convoluted into an audio signal within one convolution process section.

The reflected waves include a high-order reflected wave, and also include a reflected wave of which the path length from a virtual sound image localization position to a measurement point position is long, and accordingly, a convolution process section according to the related art becomes a relatively long section such as shown in FIG. 10. Note that the top section DLO within the convolution process section indicates delay worth equivalent to time spent for a direct wave from a virtual sound image localization position reaching a measurement point position.

As compared to the HRTF convolution method according to the related art such as in FIG. 10, with the present embodiment, a normalized HRTF for a direct wave obtained as described above, and selected normalized HRTF are convoluted into an audio signal.

Basically, with the present embodiment, when determining a virtual sound image localization position, a normalized HRTF for a direct wave between the virtual sound image localization position and a measurement point position (acoustic reproduction driver installation position) is convoluted into an audio signal. Note however, with regard to normalized HRTFs for reflected waves, only an HRTF selected according to a perceived listening environment, room configuration, or the like is convoluted into an audio signal.

For example, in the case of perceiving a listening environment such as the above-mentioned vast plain, only a reflected wave from a virtual sound image localization position to the ground surface (floor) is selected of reflected waves, a normalized HRTF obtained in a direction where the relevant reflected wave is input to the measurement point position is convoluted into an audio signal. Also, for example, in the case of a common rectangular parallelepiped shaped room, all of the reflected waves from a ceiling, floor, walls on the left and right of the listener, and walls of the forward and backward of the listener are selected, normalized HRTFs obtained in directions where these reflected waves are input to measurement point positions are convoluted.

Also, in the case of the latter room, a secondary reflection, third reflection, and so forth as well as a primary reflection are caused as reflected waves, but for example, a primary reflection alone is selected. According to an experiment, even with an audio signal in which a normalized HRTF regarding a primary reflection is convoluted, the audio signal thereof is reproduced acoustically, thereby obtaining excellent virtual sound image localization feeling. Note that if normalized HRTFs regarding a second reflected wave and thereafter are convoluted into an audio signal, when the audio signal thereof is reproduced acoustically, further excellent virtual sound image localization feeling are obtained in some cases.

A normalized HRTF regarding a direct wave is basically convoluted into an audio signal without changing the gain thereof, but with regard to reflected waves, a normalized HRTF is convoluted into an audio signal with gain corresponding to whether the reflected wave is primary reflection or second reflection or further high-order reflection. This is because normalized HRTFs obtained with the present embodiment are each measured regarding a direct wave from a perceived sound source position set in a predetermined direction, and normalized HRTF regarding reflected waves in the relevant predetermined directions are attenuated as to the direct wave. Note that the higher the order of a reflected wave is, the more the attenuation amount of a normalized HRTF regarding the reflected wave as to a direct wave increases.

Also, as described above, with regard to HRTFs of reflected waves, the present embodiment enables gain to be set further in light of the degree of sound absorption (attenuation rate of a sound wave) corresponding to the surface shape, surface configuration, material, or the like of a perceived reflection portion.

As described above, with the present embodiment, a reflected wave for convoluting an HRTF is selected, and the gain of the HRTF of each reflected wave is adjusted, whereby convolution of an HRTF as to an audio signal can be performed according to an arbitrary perceived room environment and listening environment. That is to say, like the related art, an HRTF with a room or space perceived to provide an excellent acoustic field space can be convoluted into an audio signal without measuring an HRTF with a room or space which provides an excellent acoustic field.

Figure 11:
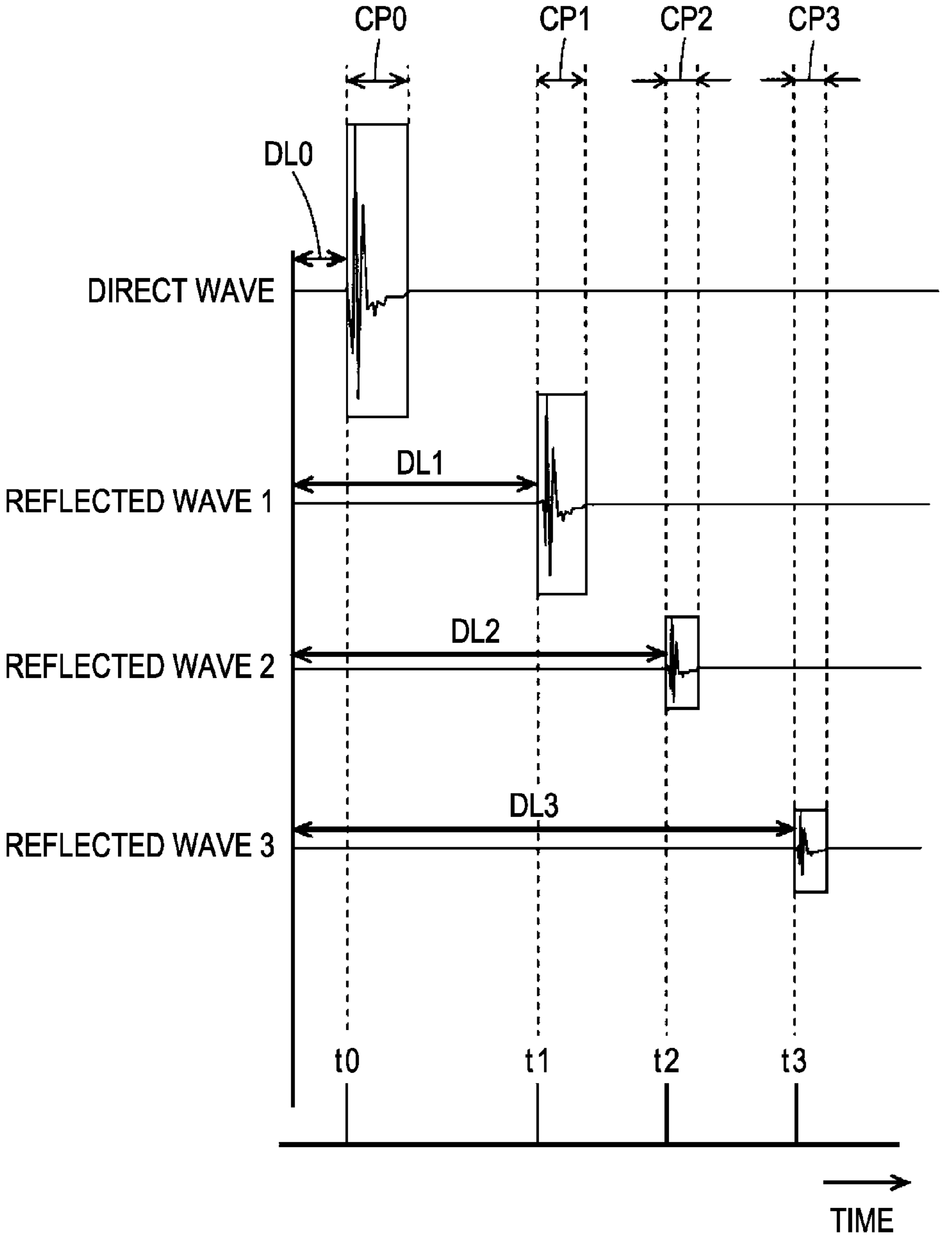
FIG. 11 is a diagram for describing a first example of a convolution process section of a normalized HRTF according to an embodiment of the present invention.
Figure 12:
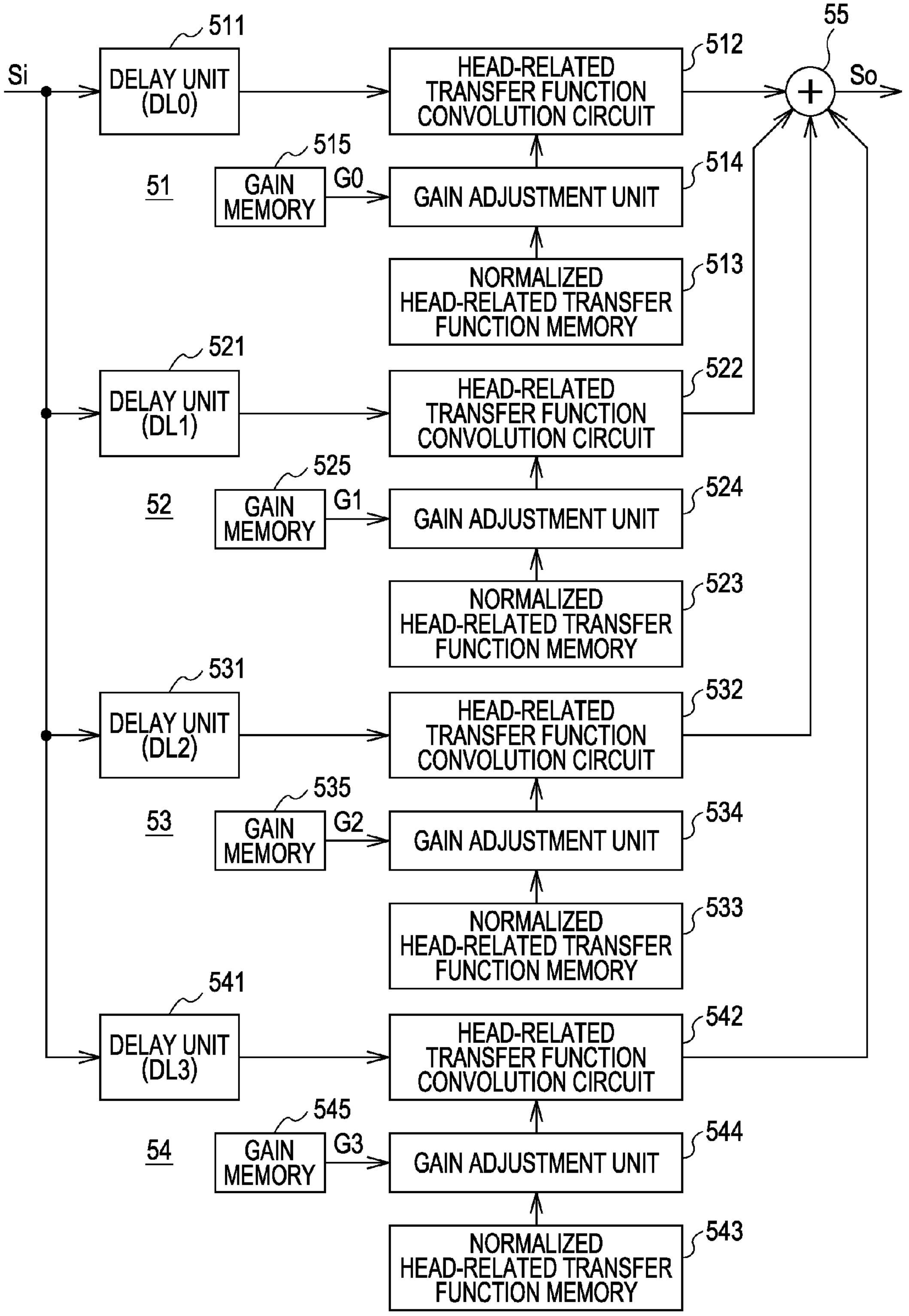
FIG. 12 is a block diagram illustrating a hardware configuration example for implementing the first example of a convolution process section of a normalized HRTF according to an embodiment of the present invention.

First Example of Convolution Method (FIGS. 11 and 12)

With the present embodiment, a normalized HRTF for a direct wave (direct wave direction HRTF), and a normalized HRTF for each of reflected waves (reflected wave direction HRTF) are, as described above, obtained independently, and accordingly, with a first example, HRTFs for a direct wave and each of reflected waves are convoluted into an audio signal independently.

For example, a case will be described wherein three reflected waves (reflected wave directions) as well as a direct wave (direct wave direction) are selected, normalized HRTFs corresponding to both (direct wave direction HRTF and reflected wave direction HRTF) are convoluted.

Delay time corresponding to the path length from a virtual sound image localization position to a measurement point position is obtained as to each of a direct wave and reflected waves beforehand. This delay time is obtained by a calculation if a measurement point position (acoustic reproduction driver position) and virtual sound image localization position are determined, and a reflection portion is determined. Subsequently, with regard to the reflected waves, the attenuation amount (gain) as to a normalized HRTF is also determined beforehand.

FIG. 11 illustrates an example of delay time, gain, and further convolution processing sections regarding a direct wave and three reflected waves. With the example in FIG. 11, with regard to a normalized HRTF for a direct wave (direct wave direction HRTF), delay DL0 equivalent to time spent for the direct wave reaching a measurement point position from a virtual sound image localization position is taken into consideration as to an audio signal. That is to say, a convolution start point of the normalized HRTF for the direct wave becomes a point in time t0 obtained by delaying the audio signal by the above-mentioned delay DL0, such as shown at the bottom of FIG. 11.

Subsequently, the normalized HRTF regarding the direction of the relevant direct wave obtained as described above is convoluted into the audio signal at a convolution process section CP0 of data length worth of the relevant normalized HRTF (600 pieces worth of data in the above example) which is started from the above-mentioned point in time t0.

Next, of the three reflected waves, with regard to the normalized HRTF of a first reflected wave 1 (reflected wave direction HRTF), delay DL1 corresponding to a path length where the first reflected wave reaches a measurement point position from a virtual sound image localization position is taken into consideration as to the audio signal. That is to say, a convolution start point of the normalized HRTF for the first reflected wave 1 becomes a point in time t1 obtained by delaying the audio signal by the delay DL1, which is shown at the bottom of FIG. 11.

Subsequently, the normalized HRTF regarding the direction of the first reflected wave 1 obtained as described above (reflected wave direction HRTF) is convoluted into the audio signal at a convolution process section CP1 of data length worth of the relevant normalized HRTF (600 pieces worth of data in the above example) which is started from the above-mentioned point in time t1. At the time of this convolution processing, the above-mentioned normalized HRTF is multiplied by gain G1 (G1<1) in light of what order the first reflected wave 1 is, and the degree of sound absorption (or the degree of reflection) at a reflection portion.

Also, similarly, with regard to the normalized HRTFs of a second reflected wave 2 and third reflected wave 3 (reflected wave direction HRTFs), delay DL2 and DL3 corresponding to a path length where the first reflected wave and third reflected wave reach a measurement point position from a virtual sound image localization position is taken into consideration as to the audio signal. That is to say, as shown at the bottom of FIG. 11, a convolution start point of the normalized HRTF for the second reflected wave 2 becomes a point in time t2 obtained by delaying the audio signal by the delay DL2, and a convolution start point of the normalized HRTF for the third reflected wave 3 becomes a point in time t3 obtained by delaying the audio signal by the delay DL3.

Subsequently, the normalized HRTF regarding the direction of the second reflected wave 2 obtained as described above (reflected wave direction HRTF) is convoluted into the audio signal at a convolution process section CP2 of data length worth of the relevant normalized HRTF (600 pieces worth of data in the above example) which is started from the above-mentioned point in time t2, and the normalized HRTF regarding the direction of the third reflected wave 3 obtained as described above (reflected wave direction HRTF) is convoluted into the audio signal at a convolution process section CP3 of data length worth of the relevant normalized HRTF (600 pieces worth of data in the above example) which is started from the above-mentioned point in time t3.

At the time of this convolution processing, the above-mentioned normalized HRTFs are multiplied by gain G2 and G3 (G2<1 and G3<1) in light of what order each of the second reflected wave 2 and third reflected wave 3 is, and the degree of sound absorption (or the degree of reflection) at a reflection portion.

FIG. 12 illustrates a hardware configuration example of a normalized HRTF convolution unit configured to execute the convolution processing of the example in FIG. 11 described above.

The example in FIG. 12 is configured of a convolution processing unit 51 for a direct wave, convolution processing units 52, 53, and 54 for the first through third reflected waves 1, 2, and 3, and adder 55. Each of the convolution processing units 51 through 54 has the completely same configuration. With this example, the convolution processing units 51 through 54 are configured of delay units 511, 521, 531, and 541, HRTF convolution circuits 512, 522, 532, and 542, normalized HRTF memory 513, 523, 533, and 543, gain adjustment units 514, 524, 534, and 544, and gain memory 515, 525, 535, and 545, respectively.

With this example, an input audio signal Si into which an HRTF should be convoluted is supplied to each of the delay units 511, 521, 531, and 541. The delay units 511, 521, 531, and 541 delay the input audio signal Si into which an HRTF should be convoluted to conversion start points in time t0, t1, t2, and t3 of the normalized HRTFs for the direct wave and first through third reflected waves, respectively. Accordingly, with this example, as shown in the drawing, the delay amounts of the delay units 511, 521, 531, and 541 are determined as DL0, DL1, DL2, and DL3, respectively.

Each of the HRTF conversion circuits 512, 522, 532, and 542 is a portion to execute processing for convoluting a normalized HRTF into an audio signal, and with this example, configured of an IIR (Infinite Impulse Response) filter or FIR (Finite Impulse Response) filter, of 600 taps.

The normalized HRTF memory 513, 523, 533, and 543 are for storing and holding a normalized HRTF to be convoluted at each of the HRTF convolution circuits 512, 522, 532, and 542. The normalized HRTF memory 513 stores and holds a normalized HRTF regarding the direction of a direct wave, the normalized HRTF memory 523 stores and holds a normalized HRTF regarding the direction of the first reflected wave, the normalized HRTF memory 533 stores and holds a normalized HRTF regarding the direction of the second reflected wave, and the normalized HRTF memory 543 stores and holds a normalized HRTF regarding the direction of the third reflected wave, respectively.

The stored and held normalized HRTF regarding the direction of a direct wave, the stored and held normalized HRTF regarding the direction of the first reflected wave, the stored and held normalized HRTF regarding the direction of the second reflected wave, and the stored and held normalized HRTF regarding the direction of the third reflected wave are, for example, selected and read out from the above-mentioned normalized HRTF memory 41, and are written in the corresponding normalized HRTF memory 513, 523, 533, and 543, respectively.

The gain adjustment units 514, 524, 534, and 544 are for adjusting the gain of a normalized HRTF to be convoluted. The gain adjustment units 514, 524, 534, and 544 multiply the normalized HRTFs from the normalized HRTF memory 513, 523, 533, and 543 by the gain values (<1) stored in the gain memory 515, 525, 535, and 545, and supply the multiplication results to the HRTF convolution circuits 512, 522, 532, and 542, respectively.

With this example, the gain value G0 (≦1) regarding a direct wave is stored in the gain memory 515, the gain value G1 (<1) regarding the first reflected wave is stored in the gain memory 525 the gain value G2 (<1) regarding the second reflected wave is stored in the gain memory 535, and the gain value G3 (<1) regarding the third reflected wave is stored in the gain memory 545.

The adder 55 adds and composites the audio signals into which the normalized HRTFs from the convolution processing unit 51 for a direct wave, and the convolution processing units 52, 53, and 54 for the first through third reflected waves have been convoluted, and outputs an output audio signal So.

With such a configuration, an input audio signal Si into which an HRTF should be convoluted is supplied to each of the delay units 511, 521, 531, and 541, and the respective input audio signals Si are delayed to the convolution start points in time t0, t1, t2, and t3 of the normalized HRTFs for the direct wave and first through third reflected waves. The input audio signals Si delayed to the convolution start points in time t0, t1, t2, and t3 of the HRTFs at the delay units 511, 521, 531, and 541 are supplied to the HRTF convolution circuits 512, 522, 532, and 542.

On the other hand, the stored and held normalized HRTF data is read out sequentially from each of the convolution start points in time t0, t1, t2, and t3 from each of the normalized HRTF memory 513, 523, 533, and 543. The readout timing control of the normalized HRTF data from each of the normalized HRTF memory 513, 523, 533, and 543 will be omitted here.

The readout normalized HRTF data is subjected to gain adjustment by being multiplied by the gain G0, G1, G2, and G3 from the gain memory 515, 525, 535, and 545 at each of the gain adjustment units 514, 524, 534, and 544, following which is supplied to each of the HRTF convolution circuits 512, 522, 532, and 542.

With each of the HRTF convolution circuits 512, 522, 532, and 542, the gain-adjusted normalized HRTF data is subjected to convolution processing at each of the convolution process sections CP0, CP1, CP2, and CP3 shown in FIG. 11. Subsequently, the convolution processing results at each of the HRTF convolution circuits 512, 522, 532, and 542 is added at the adder 55, and the addition results are output as an output audio signal So.

In the case of the first example, each of the normalized HRTFs regarding a direct wave and multiple reflected waves can be convoluted into an audio signal independently, so the delay amounts at the delay units 511, 521, 531, and 541, and gain stored in the gain memory 515, 525, 535, and 545 are adjusted, and further, the normalized HRTFs to be stored in the normalized HRTF memory 513, 523, 533, and 543 and convoluted are changed, whereby convolution of HRTFs can be readily performed according to the difference of an listening environment, such as the difference of listening environment space types such as indoor, outdoor, or the like, the difference of the shape and size of a room, and the material of a reflection portion (the degree of sound absorption and degree of reflection), and so forth.

In a case wherein the delay units 511, 521, 531, and 541 are configured of a variable delay unit capable of varying a delay amount according to external operation input such as an operator or the like, a unit for writing an arbitrary normalized HRTF selected from the normalized HRTF memory 40 by the operator in the normalized HRTF memory 513, 523, 533, and 543, and further, and a unit for allowing the operator to input and store arbitrary gain in the gain memory 515, 525, 535, and 545 are provided, convolution of an HRTF can be performed according to a listening environment such as listening environment space set arbitrarily by the operator, room environment, or the like.

For example, in a listening environment having the completely same room shape, gain can be readily changed according to the material of a wall (the degree of sound absorption and degree of reflection), and a virtual sound image localization state can be simulated according to a situation wherein the material of a wall is changed variously.

Note that, with the arrangement of the example in FIG. 11, instead of providing the normalized HRTF memory 513, 523, 533, and 543 as to the convolution processing unit 51 for a direct wave, and the convolution processing units 52, 53, and 54 for the first through third reflected waves respectively, an arrangement may be made wherein the normalized HRTF memory 40 is provided, which is common to the convolution processing units 51 through 54, and a unit configured to selectively read out an HRTF employed by each of the convolution processing units 51 through 54 from the normalized HRTF memory 40 is provided in each of the convolution processing units 51 through 54.

Note that the above-mentioned first example is description regarding the case wherein in addition to a direct wave, three reflected waves are selected, and these normalized HRTFs are convoluted into an audio signal, but in a case wherein there are three or more normalized HRTFs regarding reflected waves to be selected, with the configuration in FIG. 12, the same convolution processing units as the convolution processing units 52, 53, and 54 for reflected waves are provided as appropriate, convolution of these normalized HRTFs can be performed completely in the same way.

Note that, with the example in FIG. 11, an arrangement is made wherein the delay units 511, 521, 531, and 541 each delay the input signal Si until a convolution start point in time, so the respective delay amounts are set to DL0, DL1, DL2, and DL3. However, if an arrangement is made wherein the output end of the delay unit 511 is connected to the input end of the delay unit 521, the output end of the delay unit 521 is connected to the input end of the delay unit 531, and the output end of the delay unit 531 is connected to the input end of the delay unit 541, whereby the delay amounts at the delay units 521, 532, and 542 can be set to DL1-DL0, DL2-DL1, and DL3-DL2, and accordingly, can be reduced.

Also, in a case wherein the convolution process sections CP0, CP1, CP2, and CP3 are not overlapped mutually, the delay circuits and convolution circuits may be connected in serial while taking the time lengths of the convolution process sections CP0, CP1, CP2, and CP3 into consideration. In this case, if we say that the time lengths of the convolution process sections CP0, CP1, CP2, and CP3 are TP0, TP1, TP2, and TP3, the delay amounts at the delay units 521, 532, and 542 can be regarded as DL1-DL0-TP0, DL2-DL1-TP1, and DL3-DL2-TP2, and accordingly, further can be reduced.

Figure 13:
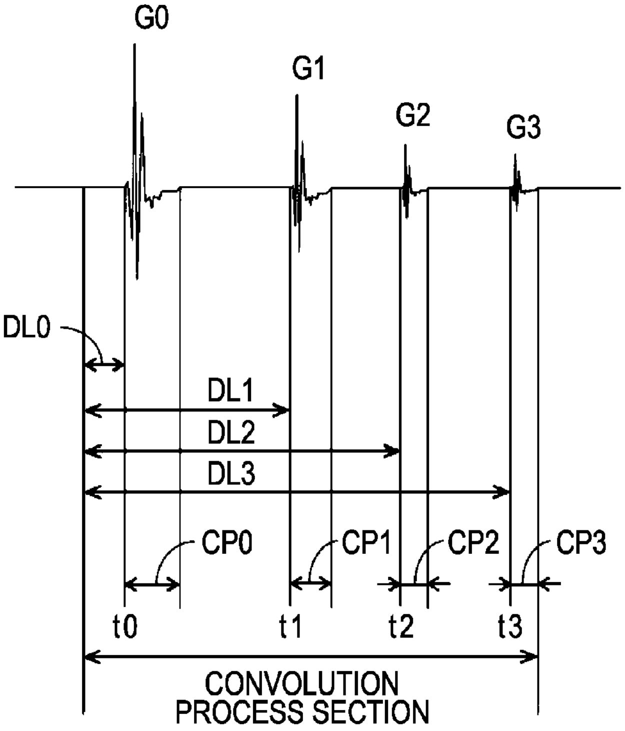
FIG. 13 is a diagram for describing a second example of a convolution process section of a normalized HRTF according to an embodiment of the present invention.
Figure 14:
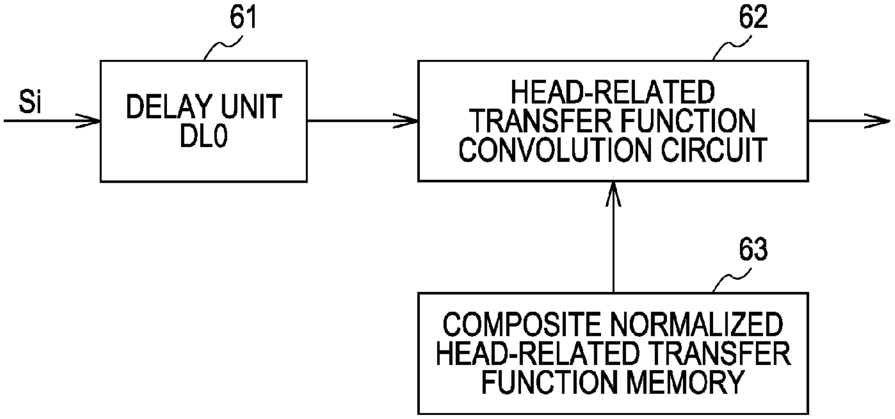
FIG. 14 is a block diagram illustrating a hardware configuration example for implementing the second example of a convolution process section of a normalized HRTF according to an embodiment of the present invention.

Second Example of Convolution Method (Coefficient Composite Processing, FIGS. 13 and 14)

This second example is employed in a case wherein an HRTF regarding a predetermined listening environment is convoluted. That is to say, in a case wherein a listening environment is determined beforehand, such as the type of listening environment space, the shape and size of a room, the material of a reflection portion (the degree of sound absorption and degree of reflection), or the like, the convolution start points in time of the normalized HRTFs regarding a direct wave and selected reflected wave are determined beforehand, and the attenuation amount (gain) at the time of convoluting each of the normalized HRTFs is also determined beforehand.

For example, HRTFs regarding a direct wave and three reflected waves are taken as an example, as shown in FIG. 13, the convolution start points in time of the normalized HRTFs for a direct wave and first through third reflected waves become the above-mentioned start points in time t0, t1, t2, and t3, and the delay amounts as to the audio signal become DL0, DL1, DL2, and DL3, respectively. Subsequently, the gain at the time of convolution of the normalized HRTFs regarding a direct wave and first through third can be determined as G0, G1, G2, and G3, respectively.

Therefore, with the second example, as shown in FIG. 13, those normalized HRTFs are composited in a time-oriented manner to generate a composite normalized HRTF, and a convolution process section is set to a period until convolution of the multiple normalized HRTFs as to an audio signal is completed.

Here, as shown in FIG. 13, the substantial convolution sections of the respective normalized HRTFs are CP0, CP1, CP2, and CP3, and there is no HRTF data in sections other than the convolution sections CP0, CP1, CP2, and CP3, and accordingly, data zero is employed as an HRTF in such sections.

In the case of the second example, a hardware configuration example of a normalized HRTF convolution unit is shown in FIG. 14. Specifically, with the second example, an input audio signal Si into which an HRTF should be convoluted is delayed at a delay unit 61 regarding an HRTF for a direct wave by a predetermined delay amount regarding the direct wave, following which is supplied to an HRTF convolution circuit 62.

A composite normalized HRTF from composite normalized HRTF memory 63 is supplied to the HRTF convolution circuit 62, and is convoluted into an audio signal. The composite normalized HRTF stored in the composite normalized HRTF memory 63 is the composite normalized HRTF described with reference to FIG. 13.

The second example involves rewriting of all of the composite normalized HRTFs even in the case of changing a delay amount, gain, or the like, but as shown in FIG. 14, includes an advantage wherein the hardware configuration of a circuit for convoluting an HRTF can be simplified.

Other Examples of Convolution Method

With both of the above-mentioned first and second examples, a normalized HRTF regarding the corresponding direction measured beforehand is convoluted into an audio signal at each of the convolution process sections CP0, CP1, CP2, and CP3, regarding a direct wave and selected reflected waves.

Note however, the convolution start points in time of HRTFs regarding selected reflected waves, and the convolution process sections CP1, CP2, and CP3 have importance, and accordingly, a signal to be convoluted actually may not be the corresponding HRTF.

Specifically, for example, with the above-mentioned first and second examples, at the convolution process section CP0 for a direct wave a normalized HRTF regarding a direct wave (direct wave direction HRTF) is convoluted, but at the convolution process sections CP1, CP2, and CP3 for reflected waves HRTFs attenuated by multiplying the same direct wave direction HRTF as the convolution process section CP0 by employed gain G1, G2, and G3 may be convoluted in a simplified manner, respectively.

Specifically, in the case of the first example, the same normalized HRTF regarding a direct wave as that in the normalized HRTF memory 513 is stored in the normalized HRTF memory 523, 533, and 543 beforehand. Alternatively, an arrangement may be made wherein the normalized HRTF memory 523, 533, and 534 are omitted, and only the normalized HRTF memory 513 is provided, the normalized HRTF for a direct wave is read out from the relevant normalized HRTF memory 513 to supply this to the gain adjustment units

524, 534, and 544 as well as the gain adjustment unit 514 at each of the convolution process sections CP1, CP2, and CP3.

Further, similarly, with the above-mentioned first and second examples, at the convolution process section CP0 for a direct wave a normalized HRTF regarding a direct wave (direct wave direction HRTF) is convoluted, but at the convolution process sections CP1, CP2, and CP3 for reflected waves an audio signal obtained by delaying an audio signal serving as a convolution target by the corresponding delay amounts DL1, DL2, and DL3 may be convoluted in a simplified manner, respectively. Specifically, holding units are provided, which are configured to hold an audio signal serving as a convolution target by the above-mentioned delay amounts DL1, DL2, and DL3 respectively, and the audio signals held at the holding units are convoluted at the convolution process sections CP1, CP2, and CP3 for reflected waves, respectively.

Figure 16:
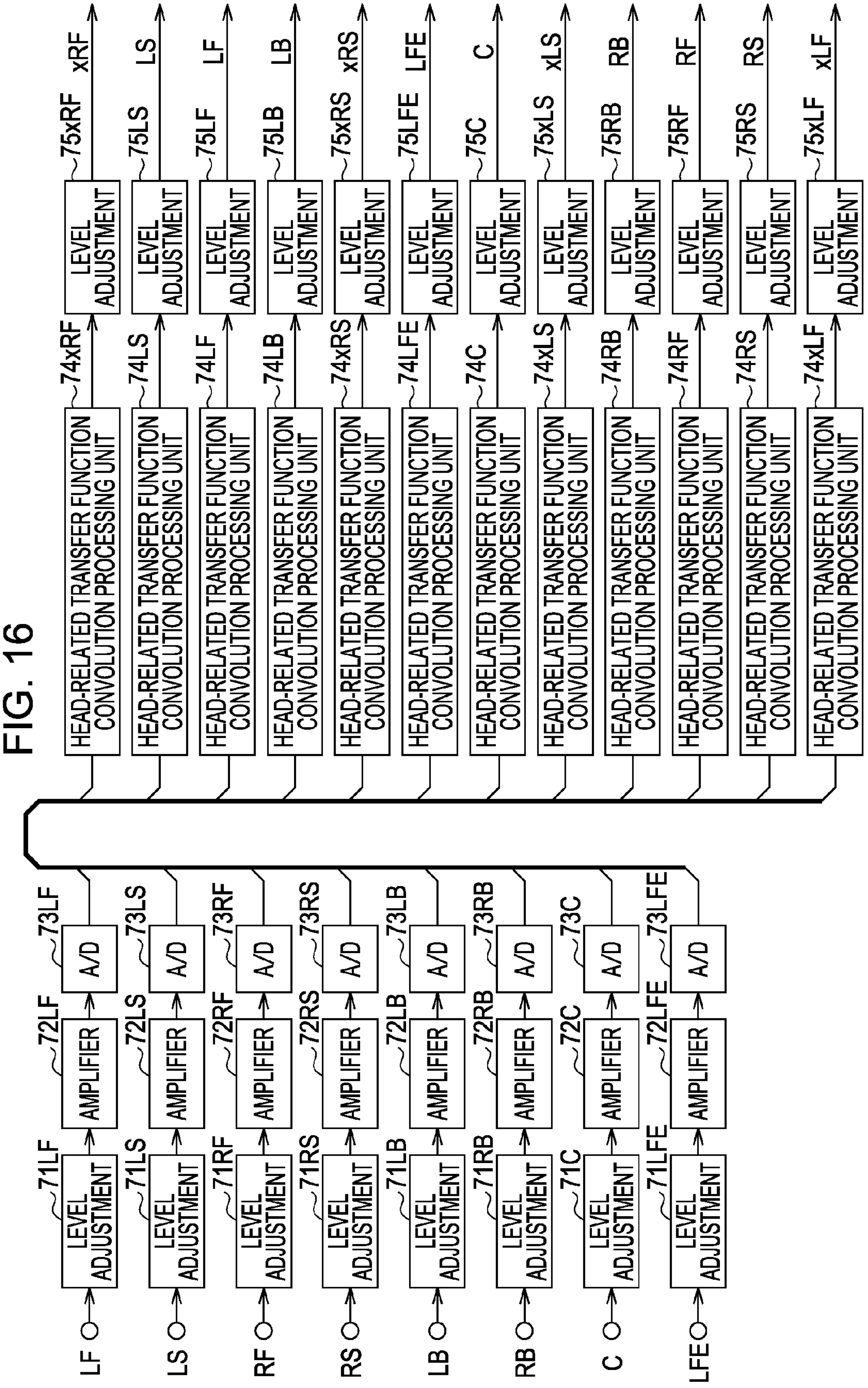
FIG. 16 is a block diagram illustrating a part of an acoustic reproduction system to which an HRTF convolution method according to an embodiment of the present invention has been applied.
Figure 17:
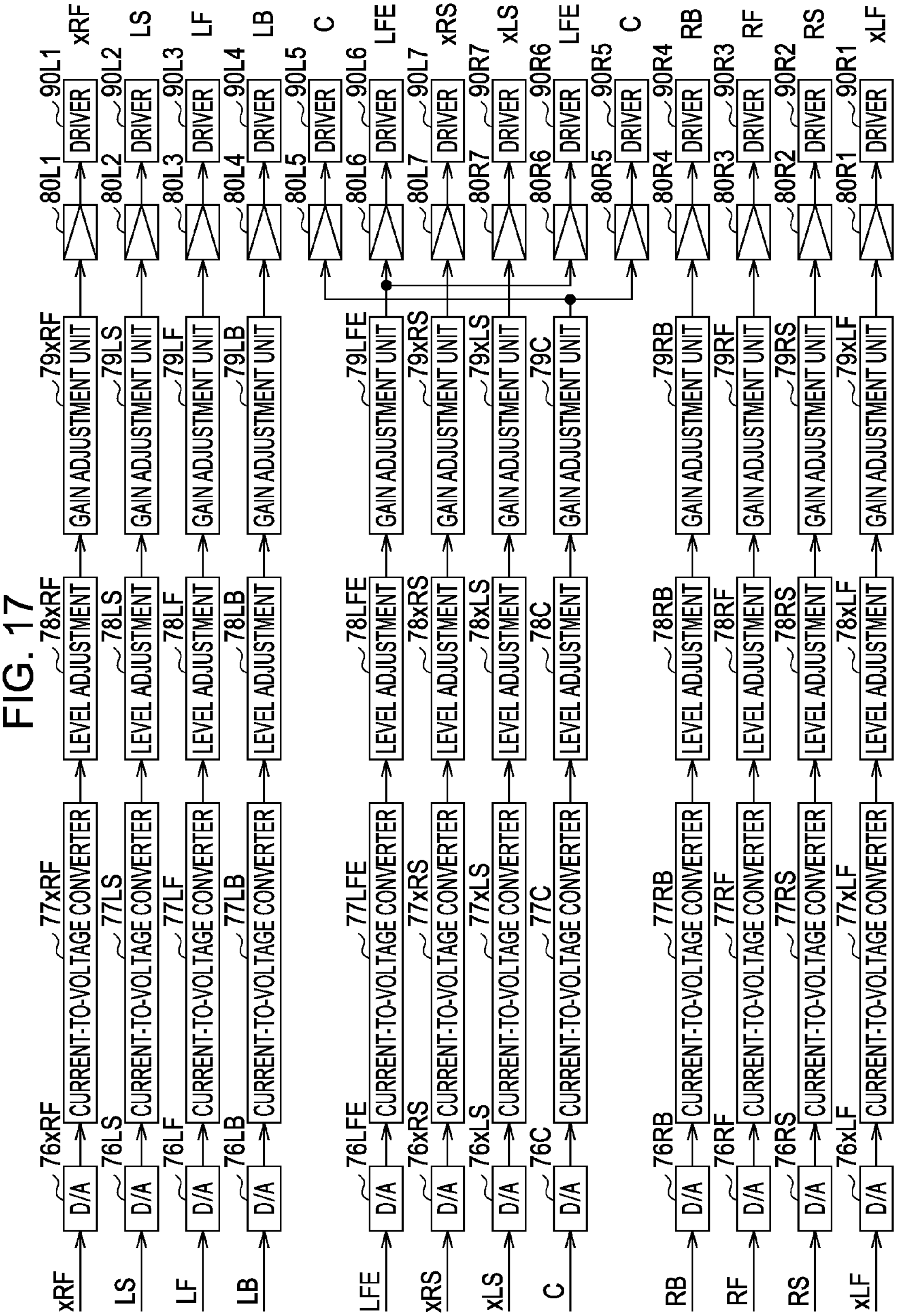
FIG. 17 is a block diagram illustrating a part of an acoustic reproduction system to which the HRTF convolution method according to an embodiment of the present invention has been applied.
Figure 18:
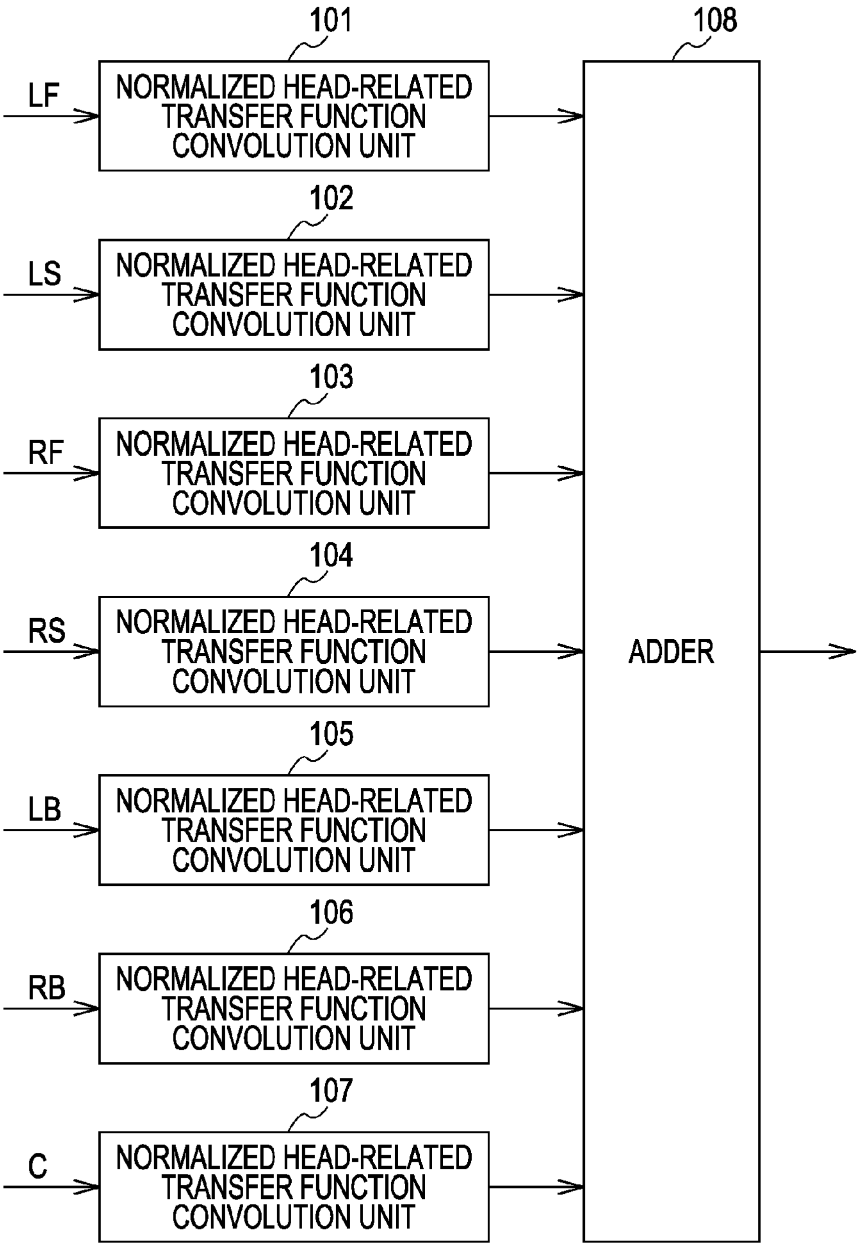
FIG. 18 is a block diagram illustrating an internal configuration example of the HRTF convolution processing unit in FIG. 16.

Example of Acoustic Reproduction System Employing HRTF Convolution Method (FIGS. 16 through 18)

Next, an HRTF convolution method according to an embodiment of the present invention will be described with reference to an example of application to a reproduction device capable of reproduction using virtual sound image localization, by applying the present embodiment to a case wherein a multi-surround audio signal is reproduced by employing headphones.

An example described below is a case wherein the placements of 7.1 channel multi-surround speakers conforming to ITU (International Telecommunication Union)-R are assumed, and an HRTF is convoluted such that the audio components of each channel are subjected to virtual sound image localization on the disposed positions of the 7.1 channel multi-surround speakers.

Figure 15:
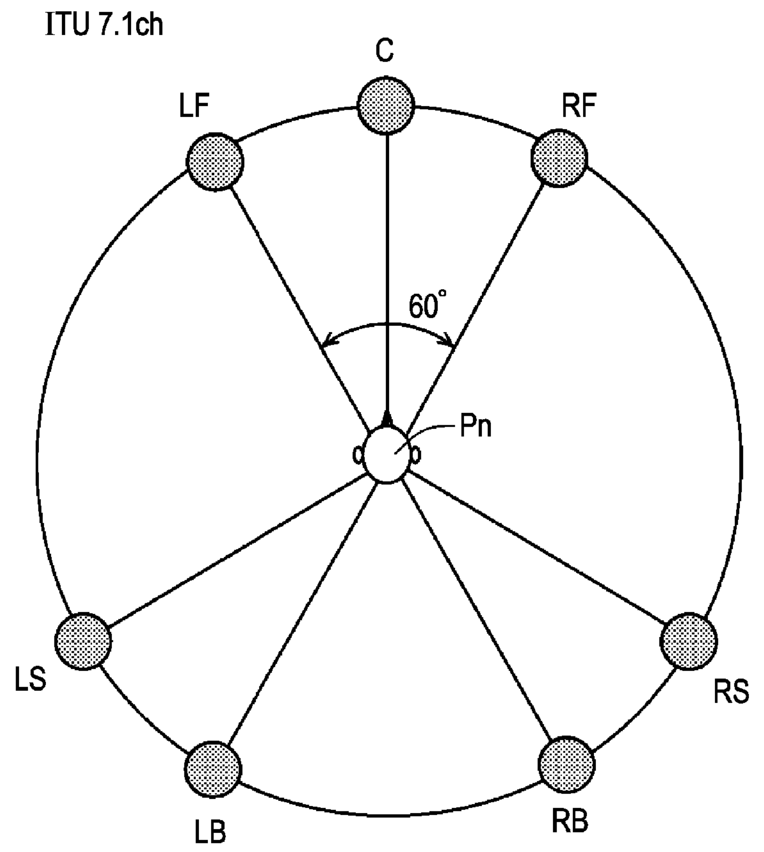
FIG. 15 is a diagram for describing an example of 7.1 channel multi-surround.

FIG. 15 illustrates an example of the placements of 7.1 channel multi-surround speakers conforming to ITU-R, wherein the speaker of each channel is disposed on the circumference with a listener position Pn as the center.

In FIG. 15, C which is the front position of a listener is a speaker position of the center channel. With the speaker position C of the center channel as the center, LF and RF which are positions apart mutually by a 60-degree angle range on the both sides thereof indicate a left front channel and right front channel, respectively.

Subsequently, in a range of 60 degrees through 150 degrees on the left and right of the front position C of the listener, a pair of speaker positions LS and LB, and a pair of speaker positions RS and RB are set on the left side and right side. These speaker positions LS and LB, and RS and RB are to be set in symmetrical positions as to the listener. The speaker positions LS and RS are speaker positions of a left lateral channel and right lateral channel, and the speaker positions LB and RB are speaker positions of a left rear channel and right rear channel.

With this acoustic reproduction system example, overhead headphones are employed wherein seven headphone drivers each are disposed as to each of both ears described above with reference to FIG. 5.

Accordingly, with this example, as shown in the above FIG. 5, in each of the horizontal direction and vertical direction as to the listener, a great number of perceived sound source positions are determined with a predetermined resolution, for example, such as for each 10-degree angle interval, and with regard to each of the great number of perceived sound source positions thereof, a normalized HRTF regarding each of the seven headphone drivers each is obtained.

Subsequently, when a 7.1 channel multi-surround audio signals are reproduced acoustically with the over-head headphones of the present example, a selected normalized HRTF is convoluted into the audio signal of each channel of the 7.1 channel multi-surround audio signals such that the 7.1 channel multi-surround audio signals are reproduced acoustically with the direction of each of the speaker positions C, LF, RF, LS, RS, LB, and RB in FIG. 15 as a vertical sound image localization direction.

FIGS. 16 and 17 illustrate a hardware configuration example of the acoustic reproduction system. The reason why the drawing is divided into FIGS. 16 and 17 is because it is difficult to illustrate the acoustic reproduction system of the present example within one paper space as a matter of convenience of the size of paper, so the continuation of FIG. 16 is FIG. 17.

Note that in FIGS. 16 and 17, the audio signal of each channel to be supplied to the speaker positions C, LF, RF, LS, RS, LB, and RB in FIG. 15 are denoted with the same symbols C, LF, RF, LS, RS, LB, and RB. Here, in FIGS. 16 and 17, an LFE (Low Frequency Effect) channel is a low-pass effect channel, this is audio of which the sound image localization direction is not determined, and accordingly, with this example, this channel is an audio channel not employed as a convolution target of an HRTF.

As shown in FIG. 16, the 7.1 channel signals, i.e., audio signals of eight channels of LF, LS, RF, RS, LB, RB, C, and LFE are supplied to A/D converters 73LF, 73LS, 73RF, 73RS, 73LB, 73RB, 73C, and 73LFE through level adjustment units 71LF, 71LS, 71RF, 71RS, 71LB, 71RB, 71C, and 71LFE, and amplifiers 72LF, 72LS, 72RF, 72RS, 72LB, 72RB, 72C, and 72LFE, and are converted into digital audio signals, respectively.

As shown in FIG. 17, with the present example, seven headphone drivers 90L1, 90L2, 90L3, 90L4, 90L5, 90L6, and 90L7 for the left ear are employed as for a crosstalk channel xRF of the right front channel, for the left lateral channel LS, for the left front channel LF, for the left rear channel LB, for the center channel C, for the low-pass effect channel LFE, and for a crosstalk channel xRS of the right lateral channel, respectively.

Also, seven headphone drivers 90R1, 90R2, 90R3, 90R4, 90R5, 90R6, and 90R7 for the right ear are employed as for a crosstalk channel xLF of the left lateral channel, for the right lateral channel RS, for the right front channel RF, for the right rear channel RB, for the center channel C, for the low-pass effect channel LFE, and for a crosstalk channel xLS of the left lateral channel, respectively.

With the present example, an arrangement is made wherein the audio signal for the center channel C, and the audio signal for the low-pass effect channel LFE are generated in common and supplied to the left and right headphone drivers 90L5 and 90R5, and headphone drivers 90L6 and 90R6, respectively. As described above, with the acoustic reproduction system shown in FIGS. 16 and 17, 12 channels worth are generated as audio signals to be supplied to the respective headphone drivers for both ears of the over-head headphones.

As shown in FIG. 16, with the present example, 12 channels worth of HRTF convolution processing units 74*x*RF, 74LS, 74LF, 74LB, 74*x*RS, 74LFE, 74C, 74*x*LS, 74RB, 74RF, 74RS, and 74*x*LF are provided.

The HRTF convolution processing unit 74*x*RF is for the crosstalk channel xRF of the right front channel, HRTF convolution processing unit 74LS is for the left lateral channel LS, HRTF convolution processing unit 74LF is for the left front channel LF, HRTF convolution processing unit 74LB is for the left rear channel LB, HRTF convolution processing unit 74*x*RS is for the crosstalk channel xRS of the right lateral channel, HRTF convolution processing unit 74LFE is for the low-pass effect channel LFE, HRTF convolution processing unit 74C is for the center channel C, HRTF convolution processing unit 74xLS is for the crosstalk channel xLS of the left lateral channel, HRTF convolution processing unit 74RB is for the right rear channel RB, HRTF convolution processing unit 74RF is for the right front channel RF, HRTF convolution processing unit 74RS is for the right lateral channel RS, and HRTF convolution processing unit 74xLF is for the crosstalk channel xLF of the left lateral channel.

With the present example, the HRTF convolution processing units 74xRF, 74LS, 74LF, 74LB, 74xRS, 74LFE, 74C, 74xLS, 74RB, 74RF, 74RS, and 74xLF have the same hardware configuration such as shown in FIG. 18.

In the case of the present example, as shown in FIG. 5, with regard to a sound wave for measurement from one perceived sound source position direction, an HRTF is measured at each of the seven microphones corresponding to the seven headphone drivers, and is each normalized as described above, thereby obtaining seven normalized HRTFs. Subsequently, the obtained seven normalized HRTFs are convoluted into seven audio signals to be supplied to the headphone drivers corresponding to the microphones for measurement, respectively.

Therefore, the HRTF convolution processing units 74xRF, 74LS, 74LF, 74LB, 74xRS, 74LFE, 74C, 74xLS, 74RB, 74RF, 74RS, and 74xLF are, as shown in FIG. 18, configured of seven normalized HRTF convolution units 101, 102, 103, 104, 105, 106, and 107 regarding the audio signals of the seven channels excluding the LFE channel, and an adder 108 configured to add the outputs from the seven normalized HRTF convolution units 101 through 107, respectively.

Each of the seven normalized HRTF convolution units 101 through 107 executes convolution processing of a normalized HRTF as to an input audio signal thereof. As the hardware configuration of each of the seven normalized HRTF convolution units 101 through 107, the hardware configuration of the first example in FIG. 12 may be employed, or the hardware configuration of the second example in FIG. 14 may be employed.

With each of the HRTF convolution processing units 74xRF, 74LS, 74LF, 74LB, 74xRS, 74LFE, 74C, 74xLS, 74RB, 74RF, 74RS, and 74xLF, each of selected normalized HRTFs to be convoluted (normalized HRTFs regarding a direct wave and reflected waves) to localize a virtual sound image as the reproduction sound field of the 7.1 channel multi surround is convoluted.

Note that, with the present example, the HRTF convolution unit 74LFE does not perform convolution processing of an HRTF, inputs the audio signal of the low-pass effect channel, and outputs this without change.

The output audio signals from the HRTF convolution processing units 74xRF, 74LS, 74LF, 74LB, 74xRS, 74LFE, 74C, 74xLS, 74RB, 74RF, 74RS, and 74xLF are, as shown in FIG. 17, supplied to D/A converters 76xRF, 76LS, 76LF, 76LB, 76xRS, 76LFE, 76C, 76xLS, 76RB, 76RF, 76RS, and 76xLF through level adjustment units 75xRF, 75LS, 75LF, 75LB, 75xRS, 75LFE, 75C, 75xLS, 75RB, 75RF, 75RS, and 75xLF, and are converted into analog audio signals, respectively.

The analog audio signals from the D/A converters 76xRF, 76LS, 76LF, 76LB, 76xRS, 76LFE, 76C, 76xLS, 76RB, 76RF, 76RS, and 76xLF are supplied to current-to-voltage converters 77xRF, 77LS, 77LF, 77LB, 77xRS, 77LFE, 77C, 77xLS, 77RB, 77RF, 77RS, and 77xLF, and are converted into voltage signals from the current signals, respectively.

Subsequently, the audio signals converted into voltage signals from the current-to-voltage converters 77xRF, 77LS, 77LF, 77LB, 77xRS, 77LFE, 77C, 77xLS, 77RB, 77RF, 77RS, and 77xLF are subjected to level adjustment as level adjustment units 78xRF, 78LS, 78LF, 78LB, 78xRS, 78LFE, 78C, 78xLS, 78RB, 78RF, 78RS, and 78xLF, following which are supplied to gain adjustment units 79xRF, 79LS, 79LF, 79LB, 79xRS, 79LFE, 79C, 79xLS, 79RB, 79RF, 79RS, and 79xLF, and are subjected to gain adjustment, respectively.

Subsequently, output audio signals from the gain adjustment units 79xRF, 79LS, 79LF, 79LB, and 79xRS are supplied to the headphone drivers 90L1, 90L2, 90L3, 90L4, and 90L7 for the left ear through amplifiers 80L1, 80L2, 80L3, 80L4, and 80L7, respectively.

Also, output audio signals from the gain adjustment units 79L×LS, 79RB, 79RF, 79RS, and 79xLF are supplied to the headphone drivers 90R7, 90R4, 90R3, 90R2, and 90R1 for the right ear through amplifiers 80R7, 80R4, 80R3, 80R2, and 80R1, respectively.

Also, an output audio signal from the gain adjustment unit 79C is supplied to the headphone driver 90L5 through an amplifier 80L5, and is also supplied to the headphone driver 90R5 through an amplifier 80R5. Further, an output audio signal from the gain adjustment unit 79LFE is supplied to the headphone driver 90L6 through an amplifier 80L6, and is also supplied to the headphone driver 90R6 through an amplifier 80R6.

Example of Normalized HRTF Convolution Start Timing with Acoustic Reproduction System (FIGS. 19 through 27)

Next, description will be made regarding normalized HRTFs to be convoluted at the HRTF convolution processing units 74xRF, 74LS, 74LF, 74LB, 74xRS, 74LFE, 74C, 74xLS, 74RB, 74RF, 74RS, and 74xLF in FIG. 16, and the convolution start timing thereof.

For example, convolution of HRTFs will be described when assuming a room of a rectangular parallelepiped shape of vertical×horizontal=4550 mm×3620 mm, and the reproduction acoustic space of 7.1 channel multi surround conforming to ITU-R wherein the distance between the left front speaker position LF and right front speaker position RF is 1600 mm. Note that, with regard to reflected waves, ceiling reflection and floor reflection will be omitted, and only wall reflection will be described here to simplify description.

With the present embodiment, a normalized HRTF regarding a direct wave, normalized HRTF regarding the crosstalk components thereof, normalized HRTF regarding a primary reflected wave, and normalized HRTF regarding the crosstalk components thereof will be convoluted.

Figure 19:
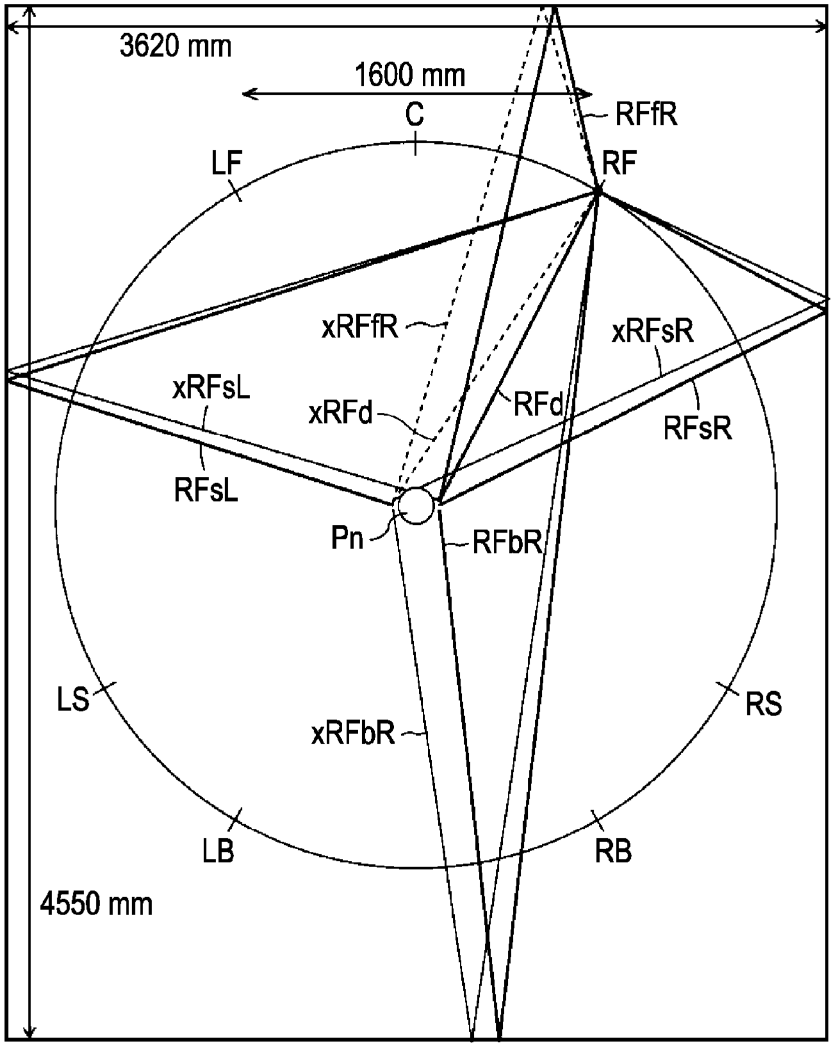
FIG. 19 is a diagram for describing an example of the direction of a sound wave for convoluting a normalized HRTF with the HRTF convolution method according to an embodiment of the present invention.

First, in order to set the right front speaker position RF to a virtual sound image localization position, the directions of sound waves regarding normalized HRTFs may be employed such as shown in FIG. 19.

Specifically, in FIG. 19, RFd denotes a direct wave from the position RF, and xRFd denotes crosstalk to the left channel thereof. Note that a symbol x denotes crosstalk. This can be applied to the following drawings.

Also, RFsR denotes a reflected wave primarily reflected at the right side wall from the position RF, and xRFsR denotes crosstalk to the left channel thereof. Also, RFFR denotes a reflected wave primarily reflected at the front wall from the position RF, and xRFfR denotes crosstalk to the left channel thereof. Also, RFsL denotes a reflected wave primarily reflected at the left wall from the position RF, and xRFsL denotes crosstalk to the left channel thereof. Further, RFbR denotes a reflected wave primarily reflected at the rear wall from the position RF, and xRFbR denotes crosstalk to the left channel thereof.

With regard to each of a direct wave and crosstalk thereof, and reflected wave and crosstalk thereof, normalized HRTFs to be convoluted are normalized HRTFs measured regarding directions where those sound waves have been input to the listener position Pn lastly. Specifically, normalized HRTFs to be convoluted are seven normalized HRTFs to be measured corresponding to the seven headphone drivers as to a sound wave in one direction, respectively. Subsequently, each of the seven normalized HRTFs is convoluted into the audio signal of the channel to be supplied to the corresponding headphone driver.

Figure 20:
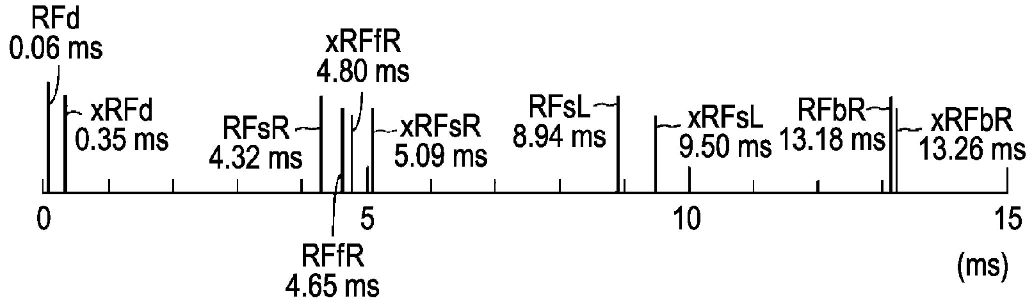
FIG. 20 is a diagram for describing an example of convolution start timing of a normalized HRTF with the HRTF convolution method according to an embodiment of the present invention.

Subsequently, points in time to start convolution of normalized HRTFs of the direct wave RFd and crosstalk xRFd thereof, and reflected waves RFsR, RfR, RFsL, and RFbR and crosstalk xRFsR, xRFfR, xRFsL, and xRFbR thereof, as to the audio signal of the right front channel RF are calculated from the path lengths of the sound waves thereof, and the calculation results such as shown in FIG. 20 are obtained.

Subsequently, with regard to the gain of a normalized HRTF to be convoluted, the attenuation amount for a direct wave is set to zero. Also, the attenuation amount for reflected waves is set according to a perceived degree of sound absorption.

Note that FIG. 20 simply illustrates points in time to start convolution of normalized HRTFs of the direct wave RFd and crosstalk xRFd thereof, and reflected waves RFsR, RFfR, RFsL, and RFbR and crosstalk xRFsR, xRFfR, xRFsL, and xRFbR thereof, as to the audio signal, but does not illustrate the convolution start point of a normalized HRTF to be convoluted into an audio signal to be supplied to the headphone driver for one channel.

Specifically, each of the normalized HRTFs of the direct wave RFd and crosstalk xRFd thereof, and reflected waves RFsR, RFfR, RFsL, and RFbR and crosstalk xRFsR, xRFfR, xRFsL, and xRFbR thereof is convoluted at the HRTF convolution unit for the channel selected from the above-mentioned HRTF convolution processing units 74*x*RF, 74LS, 74LF, 74LB, 74*x*RS, 74LFE, 74C, 74*x*LS, 74RB, 74RF, 74RS, and 74*x*LF beforehand.

This can be applied to a relation between normalized HRTFs to be convoluted to set the speaker position of another channel to a virtual sound image localization position, and an audio signal serving as a convolution target as well as the normalized HRTFs to be convoluted to set the right front speaker position RF to a virtual sound image localization position.

Next, in order to set the left front speaker position LF to a virtual sound image localization position, the directions of sound waves regarding normalized HRTFs to be convoluted can be taken as those obtained by moving the drawing shown in FIG. 19 to the left side in a symmetrical manner. Though these will not be shown in the drawing, a direct wave LFd and crosstalk xLFd thereof, a reflected wave LFsL from the left side wall and crosstalk xLFsL thereof, a reflected wave LFfL from the front wall and crosstalk xLFfL thereof, a reflected wave LFsR from the right side wall and crosstalk xLFsR thereof, and a reflected wave LFbL from the rear wall and crosstalk xLFbL thereof are obtained. Subsequently, normalized HRTFs to be convoluted are determined according to the incident directions of these as to the listener position Pn, and the convolution start timing points in time thereof are the same as those shown in FIG. 20.

Figure 21:
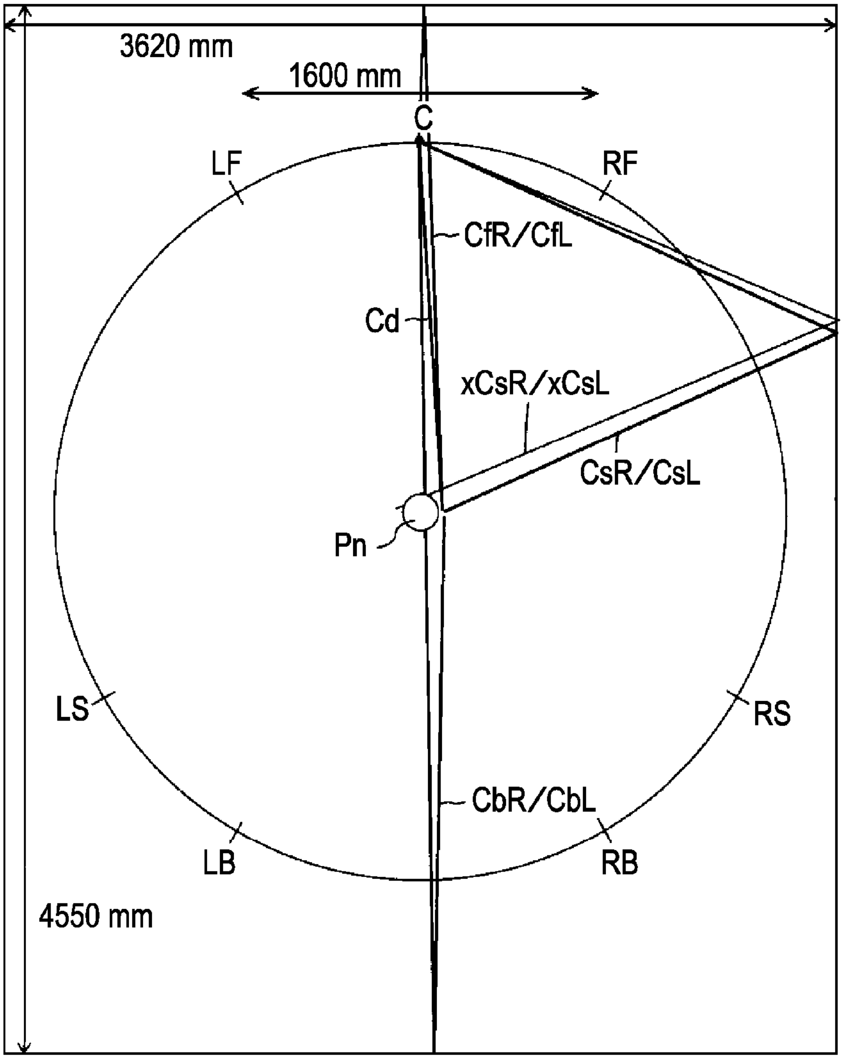
FIG. 21 is a diagram for describing an example of the direction of a sound wave for convoluting a normalized HRTF with the HRTF convolution method according to an embodiment of the present invention.

Also, similarly, in order to set the center speaker position C to a virtual sound image localization position, the directions of sound waves regarding normalized HRTFs to be convoluted are such as shown in FIG. 21.

Specifically, the directions of sound waves regarding normalized HRTFs to be convoluted are a direct wave Cd, a reflected wave CsR from the right side wall and crosstalk xCsR thereof, and a reflected wave CbR from the rear wall. Only the reflected wave on the right side is illustrated in FIG. 21, but the left side can also be set similarly, i.e., a reflected wave CsL from the left side wall and crosstalk xCsL thereof, and a reflected wave CbL from the rear wall.

Figure 22:
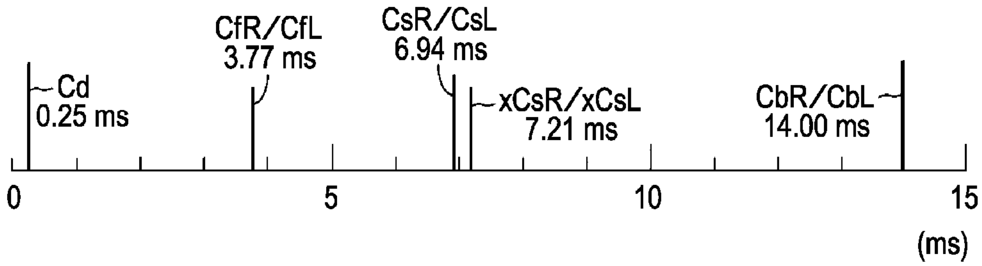
FIG. 22 is a diagram for describing an example of convolution start timing of a normalized HRTF with the HRTF convolution method according to an embodiment of the present invention.

Subsequently, normalized HRTFs to be convoluted are determined according to the incident directions of the direct wave and reflected wave, and crosstalk thereof as to the listener position Pn, and the convolution start timing points in time thereof are the same as those shown in FIG. 22.

Figure 23:
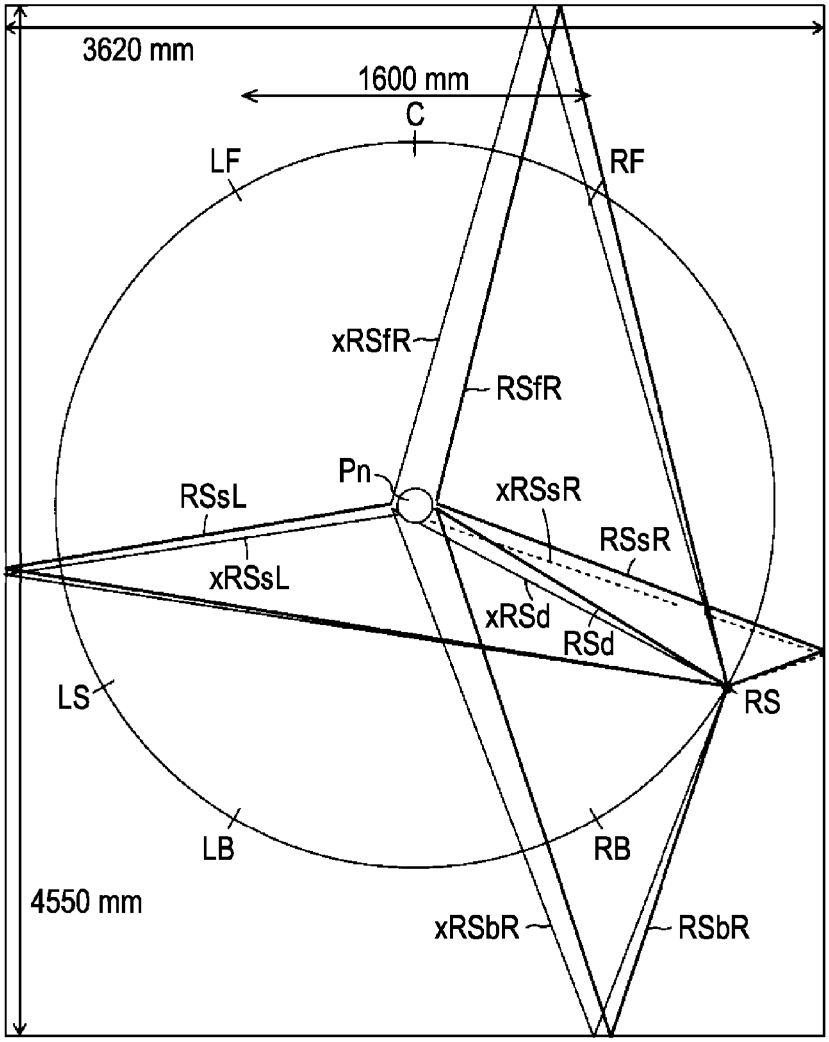
FIG. 23 is a diagram for describing an example of the direction of a sound wave for convoluting a normalized HRTF with the HRTF convolution method according to an embodiment of the present invention.
Figure 24:
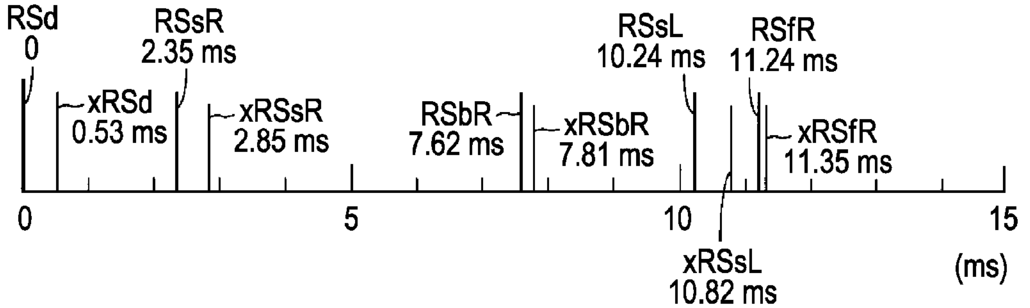
FIG. 24 is a diagram for describing an example of convolution start timing of a normalized HRTF with the HRTF convolution method according to an embodiment of the present invention.

Next, in order to set the right lateral speaker position RS to a virtual sound image localization position, the directions of sound waves regarding normalized HRTFs to be convoluted are such as shown in FIG. 23.

Specifically, a direct wave RSd and crosstalk xRSd thereof, a reflected wave RSsR from the right side wall and crosstalk xRSsR thereof, a reflected wave RSfR from the front wall and crosstalk xRSfR thereof, a reflected wave RSsL from the left side wall and crosstalk xRSsL thereof, and a reflected wave RSbR from the rear wall and crosstalk xRSbR thereof are obtained. Subsequently, normalized HRTFs to be convoluted are determined according to the incident directions of these as to the listener position Pn, and the convolution start timing points in time thereof are the same as those shown in FIG. 24.

In order to set the left lateral speaker position LS to a virtual sound image localization position, the directions of sound waves regarding normalized HRTFs to be convoluted can be taken as those obtained by moving the drawing shown in FIG. 23 to the left side in a symmetrical manner. Though these will not be shown in the drawing, a direct wave LSd and crosstalk xLSd thereof, a reflected wave LSsL from the left side wall and crosstalk xLSsL thereof, a reflected wave LSfL from the front wall and crosstalk xLSfL thereof, a reflected wave LSsR from the right side wall and crosstalk xLSsR thereof, and a reflected wave LSbL from the rear wall and crosstalk xLSbL thereof are obtained. Subsequently, normalized HRTFs to be convoluted are determined according to the incident directions of these as to the listener position Pn, and the convolution start timing points in time thereof are the same as those shown in FIG. 24.

Figure 25:
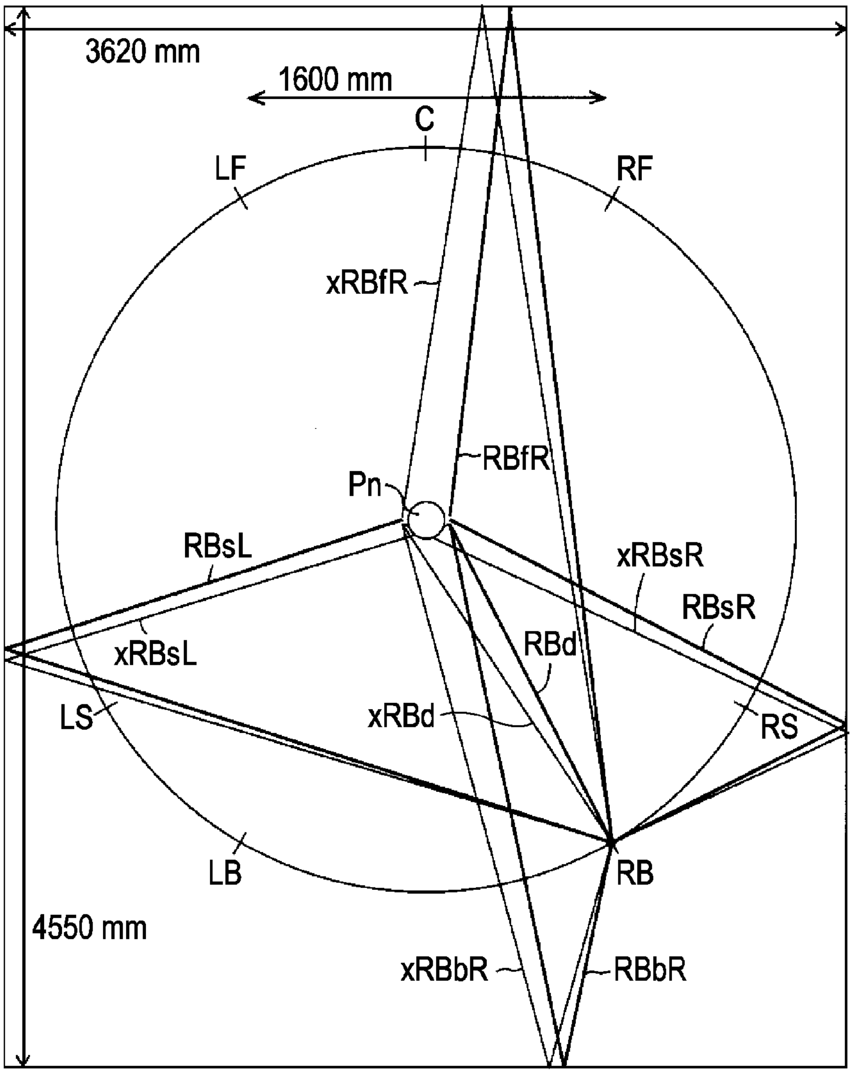
FIG. 25 is a diagram for describing an example of the direction of a sound wave for convoluting a normalized HRTF with the HRTF convolution method according to an embodiment of the present invention.
Figure 26:
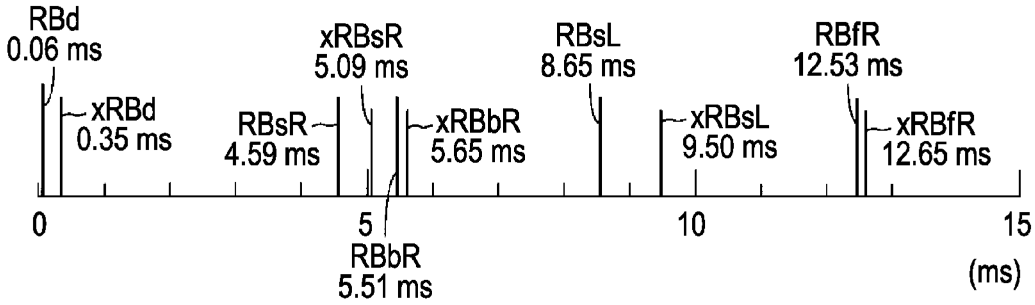
FIG. 26 is a diagram for describing an example of convolution start timing of a normalized HRTF with the HRTF convolution method according to an embodiment of the present invention.

Also, in order to set the right rear speaker position RB to a virtual sound image localization position, the directions of sound waves regarding normalized HRTFs to be convoluted are such as shown in FIG. 25.

Specifically, a direct wave RBd and crosstalk xRBd thereof, a reflected wave RBsR from the right side wall and crosstalk xRBsR thereof, a reflected wave RBfR from the front wall and crosstalk xRBfR thereof, a reflected wave RBsL from the left side wall and crosstalk xRBsL thereof, and a reflected wave RBbR from the rear wall and crosstalk xRBbR thereof are obtained. Subsequently, normalized HRTFs to be convoluted are determined according to the incident directions of these as to the listener position Pn, and the convolution start timing points in time thereof are the same as those shown in FIG. 26.

In order to set the left rear speaker position LB to a virtual sound image localization position, the directions of sound waves regarding normalized HRTFs to be convoluted can be taken as those obtained by moving the drawing shown in FIG. 25 to the left side in a symmetrical manner. Though these will not be shown in the drawing, a direct wave LBd and crosstalk xLBd thereof, a reflected wave LBsL from the left side wall and crosstalk xLBsL thereof, a reflected wave LBfL from the front wall and crosstalk xLBfL thereof, a reflected wave LBsR from the right side wall and crosstalk xLBsR thereof, and a reflected wave LBbL from the rear wall and crosstalk xLBbL thereof are obtained. Subsequently, normalized HRTFs to be convoluted are determined according to the incident directions of these as to the listener position Pn, and the convolution start timing points in time thereof are the same as those shown in FIG. 26.

Description has been made so far regarding the directions of a direct wave and reflected waves into which normalized HRTFs should be convoluted, and the convolution start timing thereof, and an example regarding whether to execute the convolution processing of these normalized HRTFs at which channel of the HRTF convolution processing units 74*x*RF, 74LS, 74LF, 74LB, 74*x*RS, 74LFE, 74C, 74*x*LS, 74RB, 74RF, 74RS, and 74*x*LF is illustrated in FIG. 27.

Figure 27A:
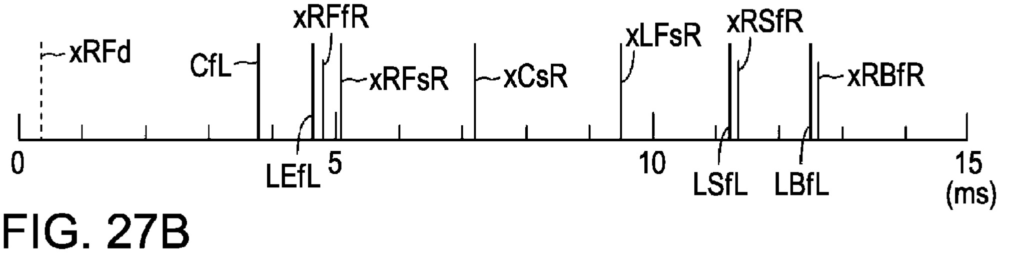
FIGS. 27A through 27F are diagrams for describing an example of convolution start timing of a normalized HRTF with the HRTF convolution method according to an embodiment of the present invention.

With the present example, FIG. 27A illustrates the convolution start timing of normalized HRTFs regarding a direct wave and reflected waves and crosstalk thereof to be convoluted at the HRTF convolution processing unit 74*x*RF which is for the crosstalk channel xRF of the right front channel.

Though normalized HRTFs regarding a direct wave and reflected waves and crosstalk thereof to be convoluted at the HRTF convolution processing unit 74*x*LF which is for the crosstalk channel xLF of the left front channel are not shown in the drawing, normalized HRTFs obtained by inverting both sides of the direct wave and reflected waves and crosstalk thereof shown in FIG. 27A are convoluted from the same start timing as the convolution start timing shown in FIG. 27A.

Figure 27B:
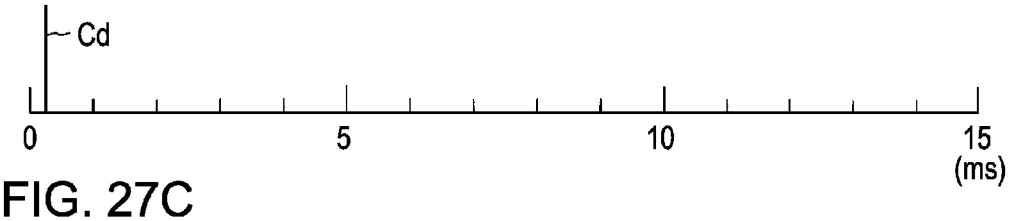

FIG. 27B illustrates the convolution start timing of normalized HRTFs regarding a direct wave Cd to be convoluted at the HRTF convolution processing unit 74C which is for the center channel C. That is to say, with the present example, only the normalized HRTF regarding the direct wave Cd of the center channel is convoluted at the HRTF convolution processing unit 74C.

Figure 27C:
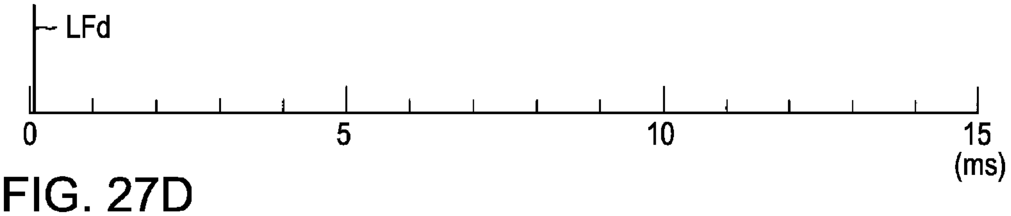

FIG. 27C illustrates the convolution start timing of normalized HRTFs regarding a direct wave LFd to be convoluted at the HRTF convolution processing unit 74LF which is for the left front channel LF. That is to say, with the present example, only the normalized HRTF regarding the direct wave LFd of the left front channel is convoluted at the HRTF convolution processing unit 74LF.

Though not shown in the drawing, only the normalized HRTF regarding the direct wave RFd of the right front channel is convoluted at the HRTF convolution processing unit 74RF which is for the right front channel RF as well.

Figure 27D:
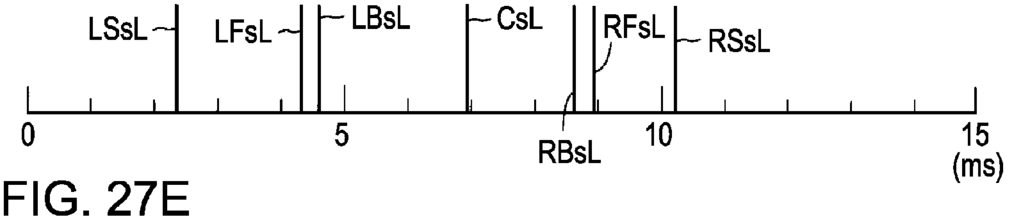

FIG. 27D illustrates the convolution start timing of normalized HRTFs regarding a direct wave and reflected waves to be convoluted at the HRTF convolution processing unit 74LB which is for the left rear channel LB.

Though not shown in the drawing, with the HRTF convolution processing unit 74RB which is for the right rear channel RB, normalized HRTFs obtained by inverting both sides of the direct wave and reflected waves shown in FIG. 27D are convoluted from the same start timing as the convolution start timing shown in FIG. 27D.

Figure 27E:
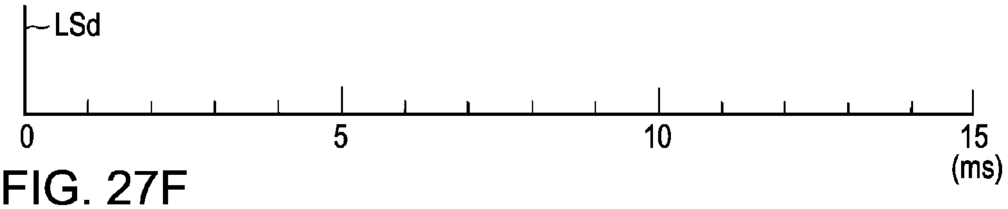

FIG. 27E illustrates the convolution start timing of normalized HRTFs regarding a direct wave LSd to be convoluted at the HRTF convolution processing unit 74LS which is for the left lateral channel LS. That is to say, with the present example, only the normalized HRTF regarding the direct wave LSd of the left lateral channel is convoluted at the HRTF convolution processing unit 74LS.

Though not shown in the drawing, only the normalized HRTF regarding the direct wave RSd of the right lateral channel is convoluted at the HRTF convolution processing unit 74RS which is for the right lateral channel RS as well.

Figure 27F:
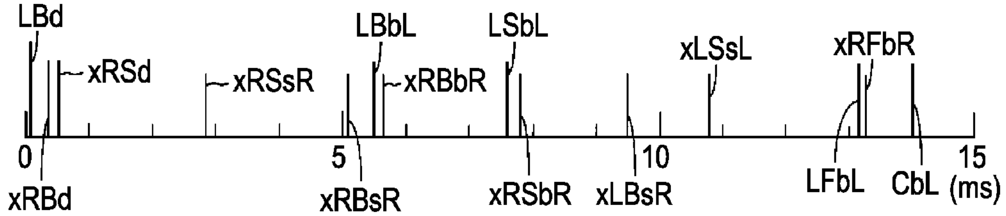

FIG. 27F illustrates the convolution start timing of normalized HRTFs regarding a direct wave and reflected waves and crosstalk thereof to be convoluted at the HRTF convolution processing unit 74*x*RS which is for the crosstalk channel xRS of the right lateral channel.

Though normalized HRTFs regarding a direct wave and reflected waves and crosstalk thereof to be convoluted at the HRTF convolution processing unit 74*x*LS which is for the crosstalk channel xLS of the left lateral channel are not shown in the drawing, normalized HRTFs obtained by inverting both sides of the direct wave and reflected waves and crosstalk thereof shown in FIG. 27F are convoluted from the same start timing as the convolution start timing shown in FIG. 27A.

Note that, as described above, the above description regarding convolution of normalized HRTFs for a direct wave and reflected waves has been made regarding only wall reflection, but may be applied to ceiling reflection and floor reflection completely in the same way.

Figure 28:
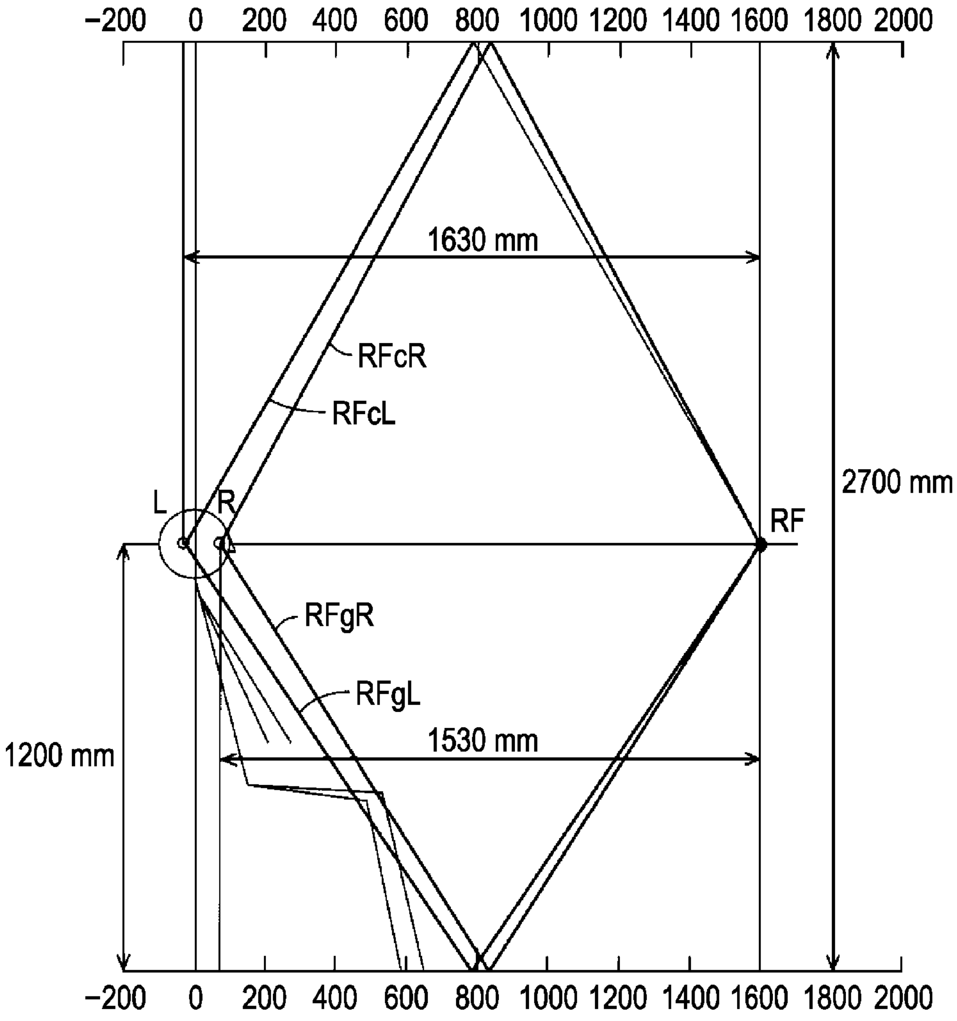
FIG. 28 is a diagram for describing an example of the direction of a sound wave for convoluting a normalized HRTF with the HRTF convolution method according to an embodiment of the present invention.

Specifically, FIG. 28 illustrates ceiling reflection and floor reflection to be considered, for example, when convoluting HRTFs to set the right front speaker RF to a virtual sound image localization position. Specifically, there can be considered a reflected wave RFcR reflected at the ceiling and input to the right ear position, similarly a reflected wave reflected at the ceiling and input to the left ear position, a reflected wave RFgR reflected at the floor and input to the right ear position, similarly a reflected wave RFgL reflected at the floor and input to the left ear position. Also, with regard to these reflected waves, though not shown in the drawing, crosstalk can be considered.

With regard to these reflected waves and crosstalk thereof as well, normalized HRTFs to be convoluted are normalized HRTFs measured regarding directions where these sound waves have been input to the listener position Pn lastly. Subsequently, the path length regarding each of the reflected waves is calculated, and the convolution start timing of each of the normalized HRTFs is determined. Subsequently, the gain of each of the normalized HRTFs is determined to be attenuation amount according to the degree of sound absorption perceived from the material, surface shape, and the like of the ceiling and floor.

Figure 29:
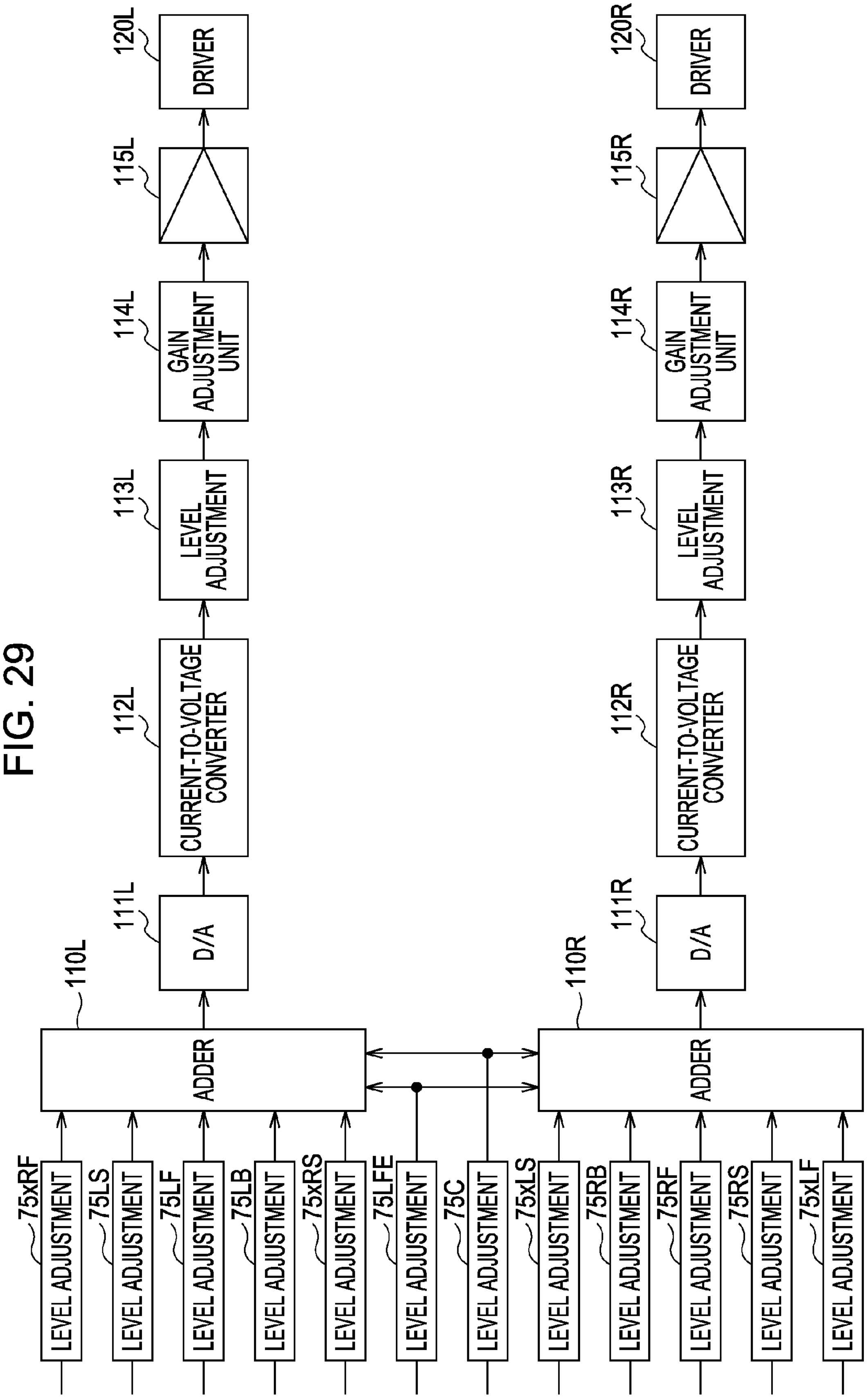
FIG. 29 is a block diagram illustrating a part of another example of an acoustic reproduction system to which the HRTF convolution method according to an embodiment of the present invention has been applied.
Figure 30:
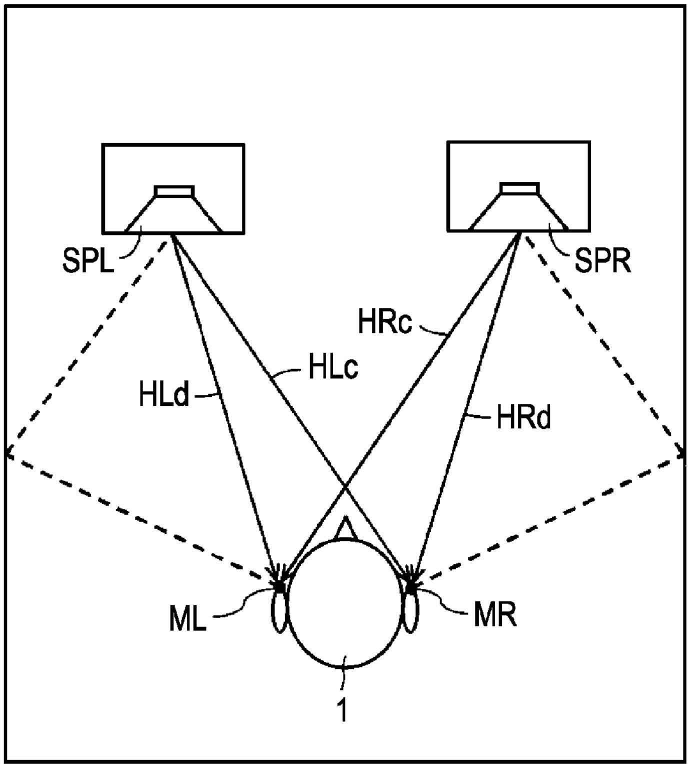
FIG. 30 is a diagram used for describing HRTFs.

Configuration Example of Second Example of Acoustic Reproduction System (FIG. 29)

The acoustic reproduction system shown in FIGS. 16 and 17 is the case wherein 7.1 channel multi surround audio signals are reproduced acoustically by the over-head headphones including the seven headphone drivers each for both ears.

On the other hand, another example described below is a case wherein 7.1 channel multi surround audio signals are reproduced acoustically by common over-head headphones including a headphone driver each for both ears.

Let us say that the example described below employs, as shown in FIG. 5, normalized HRTFs measured by disposing seven microphones each in the vicinity of both ears as for 7.1 channel multi surround. Therefore, the processing until the normalized HRTFs are convoluted can be regarded as the completely same processing as the above-mentioned acoustic reproduction system. Specifically, let us say that the hardware configuration shown in FIG. 16 is the same as with the acoustic reproduction system according to the present example.

With the acoustic reproduction system according to the present example, as shown in FIG. 29, the audio signals from the level adjustment units 75*x*RF, 75LS, 75LF, 75LB, 75*x*RS, 75LFE, and 75C are supplied to an adder 110L for the left channels to add these.

Also, the audio signals from the level adjustment units 75LFE, 75C, 75*x*LS, 75RB, 75RF, 75RS, and 75*x*LF are supplied to an adder 10R for the right channels to add these.

Subsequently, output signals from the adders 110L and 10R are supplied to D/A converters 111L and 111R, and are converted into analog audio signals, respectively. The analog audio signals from the D/A converters 111L and 111R are supplied to current-to-voltage converters 112L and 112R, and are converted into voltage signals from the current signals, respectively.

Subsequently, the audio signals converted into voltage signals from the current-to-voltage converters 112L and 112R are subjected to level adjustment at level adjustment units 113L and 113R, following which are supplied to gain adjustment units 114L and 114R to subject these to gain adjustment, respectively.

Subsequently, output audio signals from the gain adjustment units 114L and 114R are supplied to a headphone driver 120L for the left ear, and headphone driver 120R for the right ear, through amplifiers 115L and 115R, and are reproduced in an acoustic manner, respectively.

According to the second example of the acoustic reproduction system, a 7.1 channel multi surround sound field can be reproduced well with virtual sound image localization by the headphones including a head driver each for both ears.

ADVANTAGES OF THE EMBODIMENT

With the related art, in the case of performing signal processing using HRTFs, properties of the measurement system were not removed, so the sound quality following the final convolution processing deteriorated unless good-sounding expensive speakers and microphones are used for measurement. On the other hand, with the normalized HRTFs according to the present embodiment, properties of the measurement system can be removed, so HRTF convolution processing with no deterioration in sound quality can be performed even if using a measurement system using inexpensive speakers and microphones without flat properties.

Further, while ideal properties (completely flat) are elusive no matter how expensive and having good properties the speakers and microphones may be, with this embodiment HRTFs more ideal that any properties according to the related art can be obtained.

Also, HRTFs regarding only direct waves, with reflected waves eliminated, are obtained with various directions as to the listener for example as the virtual sound source position, so HRTFs regarding sound waves form each direction can be easily convoluted in the audio signals, and the reproduced sound field when convoluting the HRTFs regarding the sound waves for each direction can be readily verified.

That is to say, as described above, an arrangement may be made wherein, with the virtual sound image localization set to a particular position, not only HRTFs regarding direct waves from the virtual sound image localization position but also HRTFs regarding sound waves from a direction which can be assumed to be reflected waves from the virtual sound image localization position are convoluted, and the reproduced sound field can be verified, so as to perform verification such as which reflected waves of which direction are effective for virtual sound image localization, and so forth.

Other Embodiments

While the above description has been made regarding a case wherein headphones are primarily the electro-optical conversion unit for performing acoustic reproduction of audio signals to be reproduced, application can be made to applications where speakers are the output system, such as front surround and so forth, taking into consideration the measurement method and processing contents.

The acoustic reproduction system employing the multi surround method has been described so far, but it goes without saying that the above embodiment can be applied to common two-channel stereo.

Also, it goes without saying that the above embodiment can be applied to other multi surround cases such as 5.1 channels, 9.1 channels, and so forth other than 7.1 channels.

Also, the placements of 7.1 channel multi-surround speakers have been described with the placements of ITU-R speakers as an example, but it can be readily understood that the above embodiment can be applied to a case of the placements of speakers recommended by THX Ltd.

It should be understood by those skilled in the art that various modifications, combinations, sub-combinations and alterations may occur depending on design requirements and other factors insofar as they are within the scope of the appended claims or the equivalents thereof.

What is claimed is:

1. A head-related transfer function convolution method arranged, when an audio signal is reproduced acoustically by electro-acoustic conversion means disposed in a nearby position of both ears of a listener, to convolute a head-related transfer function into said audio signal, which allows the listener to listen to the audio signal such that a sound image is localized in a perceived virtual sound image localization position, said head-related transfer function convolution method comprising:

measuring, when a sound source is disposed in said virtual sound image localization position, and sound-collecting means are disposed in the position of said electro-acoustic conversion means,
  a direct wave direction head-related transfer function regarding a direction of a direct wave from said sound source to said sound-collecting means, and
  a reflected wave direction head-related transfer function regarding a direction of selected one reflected wave or reflected wave direction head-related transfer functions regarding the directions of selected plurality of reflected waves, from said sound source to said sound-collecting means, to obtain the direct wave direction head-related transfer function, and the reflected wave direction head-related transfer function or the reflected wave direction head-related transfer functions, separately beforehand; and convoluting said obtained direct wave direction head-related transfer function, and said reflected wave direction head-related transfer function regarding the direction of said selected one reflected wave or said reflected wave direction head-related transfer functions regarding the directions of said selected plurality of reflected waves, into said audio signal;

the measuring comprising:
  first measuring, including:
    placing acousto-electric conversion means nearby both ears of the listener where placement of electro-acoustic conversion means is assumed,
    picking up first sound waves emitted at a perceived sound source position with said acousto-electric conversion means in a state where a dummy head or a human exists at said listener position, and
    measuring the head-related transfer function from only the first sound waves directly reaching said acousto-electric conversion means; and second measuring, including:

picking up second sound waves emitted at the perceived sound source position with said acousto-electric conversion means in a state where no dummy head or human exists at said listener position, and measuring a natural-state transfer property from only the second sound waves directly reaching said acousto-electric conversion means;

normalizing said head-related transfer function measured by said first measuring with said natural-state transfer property measured by said second measuring to obtain a normalized head-related transfer function; and storing the normalized head-related transfer function obtained in said normalizing in a storage unit.

2. The head-related transfer function convolution method according to claim 1, wherein in said convoluting, corresponding convolution of said direct wave direction head-related transfer function and said reflected wave direction head-related transfer functions is executed upon a time series signal of said audio signal from each of a first start point in time to start convolution processing of said direct wave direction head-related transfer function, and a second start point in time to start convolution processing of each of the reflected wave direction head-related transfer functions, determined according to a path length of sound waves from said virtual sound image localization position and the position of said electro-acoustic conversion means of each of said direct waves and said reflected waves.

3. The head-related transfer function convolution method according to claim 1, wherein with regard to said reflected wave direction head-related transfer functions, gain is adjusted according to an attenuation rate of sound waves at a perceived reflected portion, and said convolution is executed.

4. The head-related transfer function convolution method according to claim 1, wherein in said normalizing, an amount of data equivalent to a time from said first or second sound waves emitted at said perceived sound source position to directly reach said acousto-electric conversion means is eliminated from said head-related transfer function and said natural-state transfer property obtained in said first measuring and said second measuring, and said normalization processing is performed.

5. The head-related transfer function convolution method according to claim 1, said normalizing further comprising:

performing orthogonal transform on each of time-axial data directly reaching said acousto-electric conversion means, to transform into frequency-axial data of an X-Y coordinate system;

converting each of said frequency-axial data of the X-Y coordinate system into polar coordinate system data;

performing said normalization processing in the state of said polar coordinate system data to obtain data of said normalized head-related transfer function, and return the polar coordinate system data of the normalized head-related transfer function back to said X-Y coordinate data; and performing inverse orthogonal transform of said normalized head-related transfer function returned back to said X-Y coordinate system, to transform into time-axial data.

6. The head-related transfer function convolution method according to claim 5, further comprising simplifying the time-axial data obtained by said inverse orthogonal transform by, reducing a data length of the time-axial data.

7. A head-related transfer function convolution method arranged, when an audio signal is reproduced acoustically by electro-acoustic conversion means disposed in a nearby position of both ears of a listener, to convolute a head-related transfer function into said audio signal, which allows the listener to listen to the audio signal such that a sound image is localized in a perceived virtual sound image localization position, said head-related transfer function convolution method comprising:

obtaining beforehand, when a sound source is disposed in said virtual sound image localization position and sound-collecting means are disposed in the position of said electro-acoustic conversion means, a direct wave convolution start point in time to start convolution of a direct wave direction head-related transfer function regarding a direction of a direct wave from said sound source to said sound-collecting means as to said audio signal, and a reflected wave convolution start point in time or a plurality of reflected wave convolution start points in time to start convolution of a reflected wave direction head-related transfer function regarding a direction of selected one reflected wave or the directions of selected plurality of reflected waves as to said audio signal, from said sound source to said sound-collecting means;

holding data to be convoluted as to said audio signal from said direct wave convolution start point in time, and said one reflected wave convolution start point in time or said plurality of reflected wave convolution start points in time, respectively; and convoluting said held data into said audio signal from said direct wave convolution start point in time, and said reflected wave convolution start point in time or said plurality of reflected wave convolution start points in time, respectively;

obtaining, by disposing the sound source in said virtual sound image localization position and disposing said sound-collecting means in the position of said electro-acoustic conversion means, the direct wave direction head-related transfer function regarding the direction of the direct wave from said sound source to said sound-collecting means;

wherein said direct wave direction head-related transfer function is held as data to start convolution from said direct wave convolution start point in time, and data obtained by attenuating said direct wave direction head-related transfer function according to said one or plurality of reflected wave convolution start points in time is held as data to start convolution from said one or plurality of reflected wave convolution start points in time.

8. The head-related transfer function convolution method according to claim 7, further comprising:

obtaining, by disposing the sound source in said virtual sound image localization position and disposing said sound-collecting means in the position of said electro-acoustic conversion means, the direct wave direction head-related transfer function regarding the direction of the direct wave from said sound source to said sound-collecting means, and the reflected wave direction head-related transfer function regarding the direction of a selected reflected wave or reflected wave direction head-related transfer functions regarding the directions of selected plurality of reflected waves, beforehand;

wherein said held data is said direct wave direction head-related transfer function and said one or plurality of reflected wave direction head-related transfer functions.

9. The head-related transfer function convolution method according to claim 7, further comprising:

obtaining, by disposing the sound source in said virtual sound image localization position and disposing said sound-collecting means in the position of said electro-acoustic conversion means, the direct wave direction head-related transfer function regarding the direction of a direct wave from said sound source to said sound-collecting means;

wherein said direct wave direction head-related transfer function is held as data to start convolution from said direct wave convolution start point in time, and data obtained by delaying said audio data according to said one or plurality of reflected wave convolution start points in time is held as data to start convolution from said one or plurality of reflected wave convolution start points in time.

10. A head-related transfer function convolution method arranged, when an audio signal is reproduced acoustically by an electro-acoustic conversion unit disposed in a nearby position of both ears of a listener, to convolute a head-related transfer function into said audio signal, which allows the listener to listen to the audio signal such that a sound image is localized in a perceived virtual sound image localization position, said head-related transfer function convolution method comprising:

measuring, when a sound source is disposed in said virtual sound image localization position, and a sound-collecting unit is disposed in the position of said electro-acoustic conversion unit, a direct wave direction head-related transfer function regarding a direction of a direct wave from said sound source to said sound-collecting unit, and a reflected wave direction head-related transfer function regarding a direction of selected one reflected wave or reflected wave direction head-related transfer functions regarding directions of selected plurality of reflected waves, from said sound source to said sound-collecting unit, to obtain the direct wave direction head-related transfer function, and the reflected wave direction head-related transfer function or the reflected wave direction head-related transfer functions, separately beforehand; and convoluting said obtained direct wave direction head-related transfer function, and said reflected wave direction head-related transfer function regarding the direction of said selected one reflected wave or said reflected wave direction head-related transfer functions regarding the directions of said selected plurality of reflected waves, into said audio signal;

wherein the measuring comprises:

first measuring, including:

placing acousto-electric conversion means nearby both ears of the listener where placement of electro-acoustic conversion means is assumed, picking up first sound waves emitted at a perceived sound source position with said acousto-electric conversion means in a state where a dummy head or a human exists at said listener position, and measuring the head-related transfer function from only the first sound waves directly reaching said acousto-electric conversion means; and second measuring, including:

picking up second sound waves emitted at the perceived sound source position with said acousto-electric conversion means in a state where no dummy head or human exists at said listener position, and measuring a natural-state transfer property from only the second sound waves directly reaching said acousto-electric conversion means;

normalizing said head-related transfer function measured by said first measuring with said natural-state transfer property measured by said second measuring to obtain a normalized head-related transfer function; and storing the normalized head-related transfer function obtained in said normalizing in a storage unit.

11. A head-related transfer function convolution method arranged, when an audio signal is reproduced acoustically by an electro-acoustic conversion unit disposed in a nearby position of both ears of a listener, to convolute a head-related transfer function into said audio signal, which allows the listener to listen to the audio signal such that a sound image is localized in a perceived virtual sound image localization position, said head-related transfer function convolution method comprising:

obtaining beforehand, when a sound source is disposed in said virtual sound image localization position and a sound-collecting unit is disposed in the position of said electro-acoustic conversion unit, a direct wave convolution start point in time to start convolution of a direct wave direction head-related transfer function regarding a direction of a direct wave from said sound source to said sound-collecting unit as to said audio signal, and a reflected wave convolution start point in time or a plurality of reflected wave convolution start points in time to start convolution of a reflected wave direction head-related transfer function regarding a direction of selected one reflected wave or the directions of selected plurality of reflected waves into said audio signal, from said sound source to said sound-collecting unit;

holding data to be convoluted as to said audio signal from said direct wave convolution start point in time, and said one reflected wave convolution start point in time or said plurality of reflected wave convolution start points in time, respectively; and convoluting said held data as to said audio signal from said direct wave convolution start point in time, and said reflected wave convolution start point in time or said plurality of reflected wave convolution start points in time, respectively;

obtaining, by disposing the sound source in said virtual sound image localization position and disposing said sound-collecting means in the position of said electro-acoustic conversion means, the direct wave direction head-related transfer function regarding the direction of the direct wave from said sound source to said sound-collecting means;

wherein said direct wave direction head-related transfer function is held as data to start convolution from said direct wave convolution start point in time, and data obtained by attenuating said direct wave direction head-related transfer function according to said one or plurality of reflected wave convolution start points in time is held as data to start convolution from said one or plurality of reflected wave convolution start points in time.

* * * * *